(12) United States Patent
Moroz et al.

(10) Patent No.: US 7,863,146 B2
(45) Date of Patent: Jan. 4, 2011

(54) ELEVATION OF TRANSISTOR CHANNELS TO REDUCE IMPACT OF SHALLOW TRENCH ISOLATION ON TRANSISTOR PERFORMANCE

(75) Inventors: Victor Moroz, Saratoga, CA (US); Dipankar Pramanik, Saratoga, CA (US); Xi Wei Lin, Fremont, CA (US)

(73) Assignee: Synopsys, Inc., Mountain View, CA (US)

( * ) Notice: Subject to any disclaimer, the term of this patent is extended or adjusted under 35 U.S.C. 154(b) by 220 days.

(21) Appl. No.: 11/851,325

(22) Filed: Sep. 6, 2007

(65) Prior Publication Data

US 2007/0298566 A1 Dec. 27, 2007

Related U.S. Application Data

(62) Division of application No. 11/364,391, filed on Feb. 27, 2006.

(51) Int. Cl.
*H01L 21/336* (2006.01)
*H01L 21/8238* (2006.01)
*H01L 21/76* (2006.01)

(52) U.S. Cl. .............. 438/300; 438/224; 438/427; 257/E21.548

(58) Field of Classification Search .......... 438/228, 438/224, 300, 427; 257/E21.548
See application file for complete search history.

(56) References Cited

U.S. PATENT DOCUMENTS

| 4,998,150 | A | 3/1991 | Rodder et al. |
|---|---|---|---|
| 5,854,125 | A | 12/1998 | Harvey |
| 5,923,947 | A | 7/1999 | Sur |
| 6,022,781 | A | 2/2000 | Noble, Jr. et al. |
| 6,323,113 | B1 | 11/2001 | Gabriel et al. |
| 6,551,871 | B2 * | 4/2003 | Takamura ............... 438/223 |
| 6,664,580 | B2 | 12/2003 | Jao |
| 6,791,155 | B1 | 9/2004 | Lo et al. |
| 6,831,292 | B2 | 12/2004 | Currie et al. |
| 6,881,632 | B2 | 4/2005 | Fitzgerald et al. |
| 6,974,998 | B1 | 12/2005 | Liu et al. |
| 7,119,403 | B2 | 10/2006 | Doris et al. |
| 7,190,036 | B2 | 3/2007 | Ko et al. |
| 7,266,787 | B2 | 9/2007 | Hughes et al. |
| 2003/0173588 | A1 | 9/2003 | Bianchi |

(Continued)

OTHER PUBLICATIONS

Bianchi, R.A. et al., "Accurate Modeling of Trench Isolation Induced Mechanical Stress Effects on MOSFET Electrical Performance," IEEE IEDM Tech. Digest, Dec. 2002, pp. 117-120.

(Continued)

*Primary Examiner*—Matthew C Landau
*Assistant Examiner*—Daniel Luke
(74) *Attorney, Agent, or Firm*—Warren Wolfeld; Haynes Beffel & Wolfeld LLP

(57) ABSTRACT

Roughly described, transistor channel regions are elevated over the level of certain adjacent STI regions. Preferably the STI regions that are transversely adjacent to the diffusion regions are suppressed, as are STI regions that are longitudinally adjacent to N-channel diffusion regions. Preferably STI regions that are longitudinally adjacent to P-channel diffusions are not suppressed; preferably they have an elevation that is at least as high as that of the diffusion regions.

2 Claims, 14 Drawing Sheets

U.S. PATENT DOCUMENTS

| | | | |
|---|---|---|---|
| 2004/0251512 A1* | 12/2004 | Khan et al. | 257/510 |
| 2005/0227440 A1 | 10/2005 | Ema et al. | |
| 2006/0001108 A1* | 1/2006 | Yamamoto | 257/395 |
| 2006/0220142 A1 | 10/2006 | Tamura | |
| 2007/0114632 A1 | 5/2007 | Chidambarrao et al. | |
| 2007/0194387 A1 | 8/2007 | Dyer et al. | |
| 2008/0203484 A1 | 8/2008 | Hofmann et al. | |

OTHER PUBLICATIONS

Bryant, A. et al., "Characteristics of CMOS Device Isolation for the ULSI Age," IBM Microelectronics Div., Siemens Components Inc., 1994 IEEE, pp. 28.1.1-28.1.5.

Chang, C.P. et al., "A Highly Manufacturable Corner Rounding Solution for 0.18mm Shallow Trench Isolation," Bell Laboratories, Lucent Technologies, Murray Hill, NJ 1997 IEEE, pp. 27.2.1-27.2.4.

Chen, C. et al., "A Novel 0.25 mm Shallow Trench Isolation Technology," United Microelectronics Corp., Advanced Technology Develop. Dept., Hsin-Chu, Taiwan, R.O.C. 1996 IEEE.

Eneman, G., et al., "Layout Impact on the Performance of a locally Strained PMOSFET," 2005 Symposium on VLSI Technology Digest of Technical Papers, 2005, pp. 22-23.

Kanda, Y., A Graphical Representation of the Piezoresistance Coefficients in Silicon, IEEE Transactions on Electron Devices, ED-29(1), Jan. 1982.

Moroz, et al., "Options at the 45 nm node include engineerred substraces," Solid State Technology, Jul. 2005.

Moroz, V. et al., "Analyzing strained-silicon options for stress-engineering transistors," Solid State Technology, Jul. 2004.

Nouri, F. et al., "A Systematic Study of Trade-offs in Engineering a Locally Strained pMOSFET," Proc. IEDM, 2004, pp. 1055-1058.

Shah, N., "Stress Modeling of Nanoscale MOSFET," A Thesis Presented to Graduate School of Univ. of Florida, University of Florida, 2005.

Smith, et al., "Exploring the Limits of Stress-Enhanced Hole Mobility," IEEE Electron Device Letters, 26(9), Sep. 2005.

Smith, C.S. et al., "Piezoresistance Effect in Germanium and Silicon," Physical Review, 94(1), Apr. 1054.

Thompson, S.E. et al., "A 90-nm Logic Technology Featuring Strained-Silicon," IEEE Transactions on Electron Devices, 2004.

Xuemei, Xi (Jane) et al., "BSIM4.3.0 Model, Enhancements and Imrpovements Relative to BSIM4.2.1," University of California at Berkeley (2003), available at http://www-devices.eecs.berkeley.edu/~bsim3/BSIM4/BSIM430/doc/BSIM430_Enhancement.pdf.

Office Action mailed Oct. 30, 2007 in U.S. Appl. No. 11/364,391.

Response filed Jan. 24, 2008 to Office Action mailed Oct. 30, 2007 in U.S. Appl. No. 11/364,391.

Office Action mailed Mar. 27, 2008 in U.S. Appl. No. 11/364,391.

Response (RCE) filed Jul. 11, 2008 to Office Action mailed Mar. 27, 2008 in U.S. Appl. No. 11/364,391.

Office Action mailed Sep. 17, 2008 in U.S. Appl. No. 11/364,391.

Response filed Oct. 13, 2008 to Office Action mailed Sep. 17, 2008 in U.S. Appl. No. 11/364,391.

Office Action mailed Dec. 23, 2008 in U.S. Appl. No. 11/364,391.

Response filed Jan. 20, 2009 to Office Action mailed Dec. 23, 2008 in U.S. Appl. No. 11/364,391.

Office Action mailed Apr. 24, 2009 in U.S. Appl. No. 11/364,391.

Response filed Sep. 25, 2009 to Office Action mailed Dec. 23, 2008 in U.S. Appl. No. 11/364,391.

* cited by examiner

ELEVATION OF TRANSISTOR CHANNELS TO REDUCE IMPACT OF SHALLOW TRENCH ISOLATION ON TRANSISTOR PERFORMANCE

CROSS-REFERENCE TO RELATED APPLICATIONS

This is a division of application Ser. No. 11/364,391, filed 27 Feb. 2007.

FIELD OF THE INVENTION

The invention relates to methods and systems for improving integrated circuit performance through stress-engineering of the layout, and articles manufactured thereby.

Introduction

It has long been known that semiconductor materials such as silicon and germanium exhibit the piezoelectric effect (mechanical stress-induced changes in electrical resistance). See for example C. S. Smith, "Piezoresistance effect in germanium and silicon", Phys. Rev., vol. 94, pp. 42-49 (1954), incorporated by reference herein. The piezoelectric effect has formed the basis for certain kinds of pressure sensors and strain gauges, but only recently has it received attention in the manufacture of integrated circuits. In integrated circuit fabrication, one of the major sources of mechanical stress is the differential expansion and contraction of the different materials used. For example, typical fabrication technologies involve electrically isolating the active regions of groups of one or more transistors by surrounding them with shallow trench isolation (STI) regions which are etched into the silicon and then filled with an insulator, such as an oxide. The filling is performed at an elevated temperature. During the subsequent wafer cooling, oxides tend to shrink less than the surrounding silicon, and therefore develop a state of compressive stress laterally on the silicon regions of the device. Of significance is the stress exerted by the STI regions on the silicon forming a Metal-Oxide-Semiconductor Field-Effect Transistor (MOSFET) channel, because the piezoelectric impact of such stress can affect carrier mobility, and therefore current flow through the channel (Ion). In general, the higher the electron mobility in the channel, the faster the transistor switching speed.

The stress exerted on a region of silicon decays rapidly as a function of distance from the stress-causing interfaces. In the past, therefore, while process technologies could not produce today's extremely narrow channel widths, the stress-induced impact on performance could be ignored because only the edges of the diffusion region (adjacent to the STI regions) were affected. The channel regions were too far away from the STI regions to exhibit any significant effect. As process technologies have continued to shrink, however, the piezoelectric effect on transistor performance is no longer negligible.

Methods have been developed to model the impact of stress on the behavior of integrated circuit devices at the level of individual transistors. These methods include, for example, full-scale analysis with a Technology Computer Aided Design (TCAD) system; and a method known as the "Length-of-Diffusion" (LOD) method described in R. A. Bianchi et al., "Accurate Modeling of Trench Isolation Induced Mechanical Stress Effects on MOSFET Electrical Performance," IEEE IEDM Tech. Digest, pp. 117 120 (December 2002), in U.S. Patent Publication No. 2002/0173588 (2003), and in Xuemei (Jane) Xi, et al., "BSIM4.3.0 Model, Enhancements and Improvements Relative to BSIM4.2.1", University of California at Berkeley (2003), available at http://www.device-.eecs.berkeley.edu/, all incorporated herein by reference. In addition, U.S. patent application Ser. No. 11/291,294, filed Dec. 1, 2005, by inventors Victor Moroz and Dipankar Pramanik, entitled "Analysis of Stress Impact on Transistor Performance", Docket No. SYNP 0693-1, incorporated herein by reference, describes another method for stress analysis of integrated circuit layouts.

Behaviors characterized by the various methods for analyzing stress impact at the level of individual transistors can be used to derive circuit level parameters (e.g. SPICE parameters) of the device for subsequent analysis of the circuit at macroscopic levels. Such analysis can help predict whether the circuit will operate as intended, and with what margins, or whether the design or layout needs to be revised. If revision is necessary, it typically involves applying certain general rules-of-thumb, such as increasing the size of any transistor that, according to the stress analysis, turns out to be weaker than expected. But increasing the transistor size can degrade other performance measures, such as power consumption, so a compromise becomes necessary. In addition, the impact of stress on transistor performance is layout sensitive. Since typical irregularities in an integrated circuit layout result in different amount of impact on the performance of different transistors across the layout, these kinds of compromises typically must be made manually on a transistor-by-transistor basis. Still further, if automated place-and-route software is then used to re-layout the revised circuit design, the revised layout will differ from the original and show different stress effects than the original, often completely upsetting the circuit modifications that were made to accommodate the stress impact of the original layout.

The invention described herein addresses methods and systems for improving integrated circuit layouts and fabrication processes in order to better account for stress effects. In some aspects of the invention, dummy features are added to a layout either in order to improve uniformity throughout the layout, or to relax known undesirable stress, or to introduce known desirable stress. These dummy features do not involve circuit modification, so no compromise among the above transistor performance measures is required. They also for the most part do not involve another pass through automated place-and-route software, so these layout modifications often can be made without risk that their benefit will be upset by the re-layout process. The dummy features can include dummy diffusion regions added within STI regions to relax stress, and dummy trenches added within STI regions either to relax or increase stress. A trench can relax stress by filling it with a stress-neutral material or a tensile strained material. A trench can increase stress by filling it with a compressive strained material. Preferably dummy diffusion regions and stress relaxation trenches are disposed longitudinally to at least the channel regions of N-channel transistors, and transversely to at least the channel regions of both N-channel and P-channel transistors. Preferably compressive stress enhancement trenches are disposed longitudinally to at least the channel regions of P-channel transistors.

In another aspect, stress relaxation trenches are disposed alongside power supply buses, within STI regions separating the power supply buses from active diffusion regions.

In another aspect, a fast stress analysis algorithms can be used to approximate the stress in one or more transistor channels, and layout revisions such as the above. The stress can be approximated again, and further layout revisions made, and so on iteratively until the stress in the channel, or the value of one or more performance parameters, are satisfactory.

In another aspect, a standard cell layout is stress-modified so as to improve its stress uniformity and/or to better isolate it from stresses induced by features outside the standard cell layout itself.

In yet another aspect, transistor channel regions are elevated over the level of certain adjacent STI regions. Preferably the STI regions that are transversely adjacent to the diffusion regions are suppressed, as are STI regions that are longitudinally adjacent to N-channel diffusion regions. Preferably STI regions that are longitudinally adjacent to P-channel diffusions are not suppressed; preferably they have an elevation that is at least as high as that of the diffusion regions.

BRIEF DESCRIPTION OF THE DRAWINGS

The invention will be described with respect to specific embodiments thereof, and reference will be made to the drawings, in which.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1:
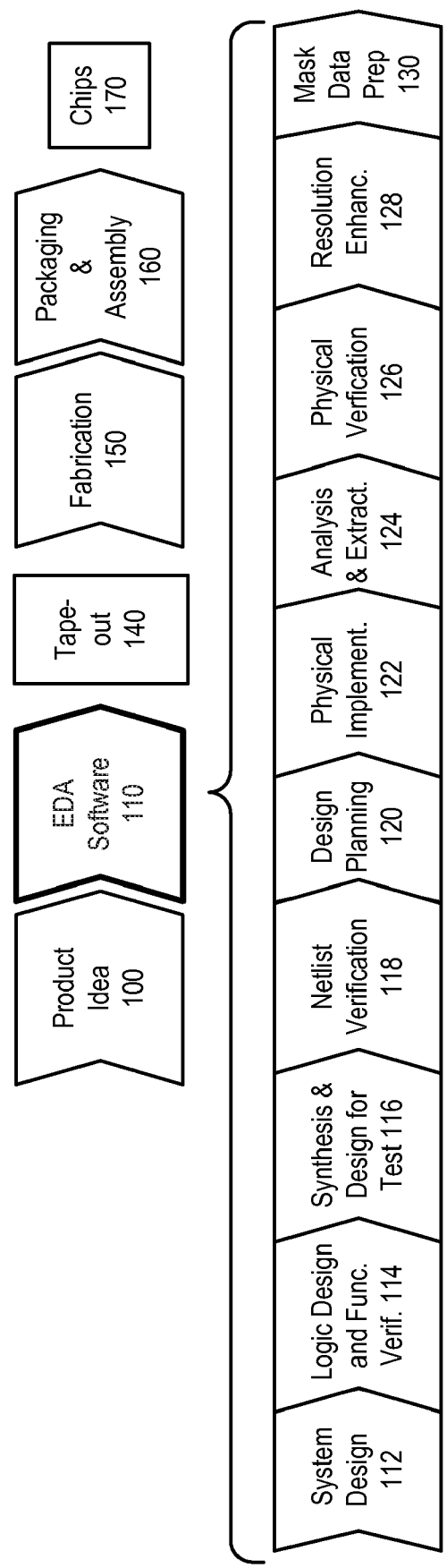
FIG. 1 shows a simplified representation of an illustrative digital integrated circuit design flow.

FIG. 1 shows a simplified representation of an illustrative digital integrated circuit design flow. At a high level, the process starts with the product idea (step 100) and is realized in an EDA (Electronic Design Automation) software design process (step 110). When the design is finalized, it can be taped-out (step 140). After tape out, the fabrication process (step 150) and packaging and assembly processes (step 160) occur resulting, ultimately, in finished integrated circuit chips (result 170).

The EDA software design process (step 110) is actually composed of a number of steps 112-130, shown in linear fashion for simplicity. In an actual integrated circuit design process, the particular design might have to go back through steps until certain tests are passed. Similarly, in any actual design process, these steps may occur in different orders and combinations. This description is therefore provided by way of context and general explanation rather than as a specific, or recommended, design flow for a particular integrated circuit.

A brief description of the components steps of the EDA software design process (step 110) will now be provided.

System design (Step 112): The designers describe the functionality that they want to implement, they can perform what-if planning to refine functionality, check costs, etc. Hardware-software architecture partitioning can occur at this stage. Example EDA software products from Synopsys, Inc. that can be used at this step include Model Architect, Saber, System Studio, and DesignWare® products.

Logic design and functional verification (Step 114): At this stage, the VHDL or Verilog code for modules in the system is written and the design is checked for functional accuracy. More specifically, the design is checked to ensure that produces the correct outputs in response to particular input stimuli. Example EDA software products from Synopsys, Inc. that can be used at this step include VCS, VERA, DesignWare®, Magellan, Formality, ESP and LEDA products.

Synthesis and design for test (Step 116): Here, the VHDL/Verilog is translated to a netlist. The netlist can be optimized for the target technology. Additionally, the design and implementation of tests to permit checking of the finished chip occurs. Example EDA software products from Synopsys, Inc. that can be used at this step include Design Compiler®, Physical Compiler, Test Compiler, Power Compiler, FPGA Compiler, Tetramax, and DesignWare® products.

Netlist verification (Step 118): At this step, the netlist is checked for compliance with timing constraints and for correspondence with the VHDL/Verilog source code. Example EDA software products from Synopsys, Inc. that can be used at this step include Formality, PrimeTime, and VCS products.

Design planning (Step 120): Here, an overall floor plan for the chip is constructed and analyzed for timing and top-level routing. Example EDA software products from Synopsys, Inc. that can be used at this step include Astro and IC Compiler products.

Physical implementation (Step 122): The placement (positioning of circuit elements) and routing (connection of the same) occurs at this step. Example EDA software products from Synopsys, Inc. that can be used at this step include the Astro and IC Compiler products. Certain aspects of the invention herein can take place during this step, or just afterwards.

Analysis and extraction (Step 124): At this step, the circuit function is verified at a transistor level, this in turn permits what-if refinement. Example EDA software products from Synopsys, Inc. that can be used at this step include AstroRail, PrimeRail, Primetime, and Star RC/XT products. Certain aspects of the invention can take place during this step as well.

Physical verification (Step 126): At this step various checking functions are performed to ensure correctness for: manufacturing, electrical issues, lithographic issues, and circuitry. Example EDA software products from Synopsys, Inc. that can be used at this step include the Hercules product.

Resolution enhancement (Step 128): This step involves geometric manipulations of the layout to improve manufacturability of the design. Example EDA software products from Synopsys, Inc. that can be used at this step include Proteus, ProteusAF, and PSMGen products.

Mask data preparation (Step 130): This step provides the "tape-out" data for production of masks for lithographic use to produce finished chips. Example EDA software products from Synopsys, Inc. that can be used at this step include the CATS(R) family of products.

Figure 2:
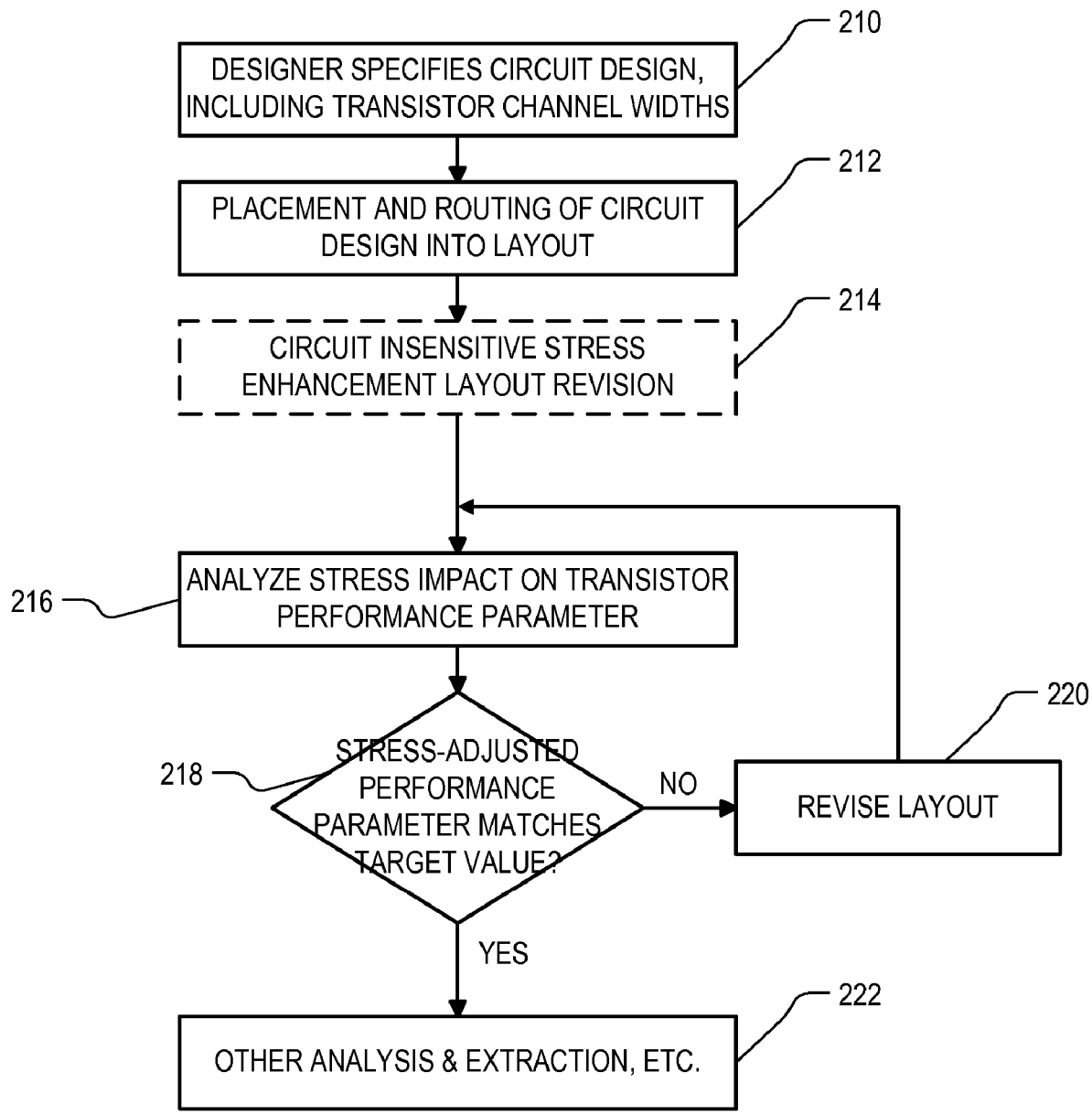
FIG. 2 is a flowchart illustrating portions of steps in FIG. 1 involved in implementing aspects of the invention.

FIG. 2 is a flowchart illustrating portions of steps 122 and 124 (FIG. 1) involved in implementing aspects of the invention. As with all flowcharts herein, it will be appreciated that many of the steps in FIG. 2 can be combined, performed in parallel or performed in a different sequence without affecting the functions achieved. In step 210, corresponding roughly to steps 100 and 112-120 in FIG. 1, the designer specifies a circuit design. As used herein, an "integrated circuit design" is a transistor level design, after synthesis from VHDL and before layout. A designer can "specify" an integrated circuit design either by specifying it at the transistor level, or by specifying at a higher level and manually or automatically converting it to the transistor level through one or more sub-steps.

For purposes of some aspects of the invention, in the integrated circuit design in step 210, the designer has already specified (again, explicitly or implicitly) the channel length/width (L/W) ratios desired for each transistor. Since in a typical integrated circuit technology the channel lengths of most transistors are the same, effectively the specification of L/W ratios is also a specification of the ratio that each transistor's channel width bears to every other transistor's channel width. Many factors are considered in the selection of L/W ratios, one of which is the minimum required current-carrying capacity Ion of the transistor in the ON state. In particular, it is known that, absent stress considerations, the Ion of a transistor is roughly proportional to its channel width. That is, the ratio of Ion of one transistor to that of a second transistor is roughly equal to the ratio of their channel widths. So if one transistor is required to supply twice the current for downstream circuitry that a second transistor is required to supply, then the first transistor would be assigned twice the channel width as the second transistor. Based on this principle, one can determine from the relative channel widths assigned to different transistors in an integrated circuit design, the ratios of Ion's that were intended by the designer for such transistors.

In step 212, the circuit design undergoes "placement", and optionally "routing" as well, thereby resulting in a "layout". Step 212 corresponds roughly to part of step 122 (FIG. 1). As used herein, a "layout" defines a set of masks that, when applied in a fabrication process, together define the physical features of the integrated circuit device. Among other things, these features can include transistor source, drain and channel regions, and diffusion regions, and STI regions, and so on, and together these features define circuit structures such as the transistors specified in the integrated circuit design. The masks defined by a "layout", as that term is used herein, may (and typically do) go through one or more post-processing steps such as steps 126-130 (FIG. 1) before they are finalized for production. Although a layout typically defines masks for all of the fabrication process steps, it will be appreciated that for some aspects of the present invention the integrated circuit design need only be compiled to the point of a layout that defines fewer than all such masks. For example, for some aspects the layout need not yet define masks for the so-called "back-end" fabrication steps, such as the formation of routing and via layers.

In step 214, in one aspect of the invention, certain stress-related enhancements can be added to the layout without specific knowledge of the circuitry or device structures. These are enhancements that improve circuit performance or improve uniformity in most layouts.

Some of the circuit non-specific stress-related enhancements are based on the understanding that compressive stress exerted on transistor channel regions enhances performance in certain kinds of situations, and degrades transistor performance in other kinds of situations. For example, compressive stress exerted longitudinally or transversely on the channel of an N-channel transistor can degrade certain performance parameters of the transistor. Specifically, electron and hole mobility, and therefore Ion and transistor switching speed, often can degrade by as much as 20-30%/GPa. Layout enhancements that reduce or relieve compressive stress in the channels of N-channel transistors, therefore, are very likely to enhance the performance of these transistors. As another example, compressive stress exerted transversely across the channel of a P-channel transistor often can degrade electron and hole mobility, and therefore Ion and transistor switching speed, by as much as 70%/GPa. On the other hand, compressive stress exerted longitudinally on the channel of a P-channel transistor often can enhance hole mobility, and therefore Ion and transistor switching speed, by as much as 90%/GPa. Layout enhancements that reduce or relieve transverse compressive stress in the channel of P-channel transistors, and layout enhancements that increase longitudinal compressive stress in the channels of P-channel transistors, therefore, are all very likely to enhance the performance of these transistors.

Figure 3:
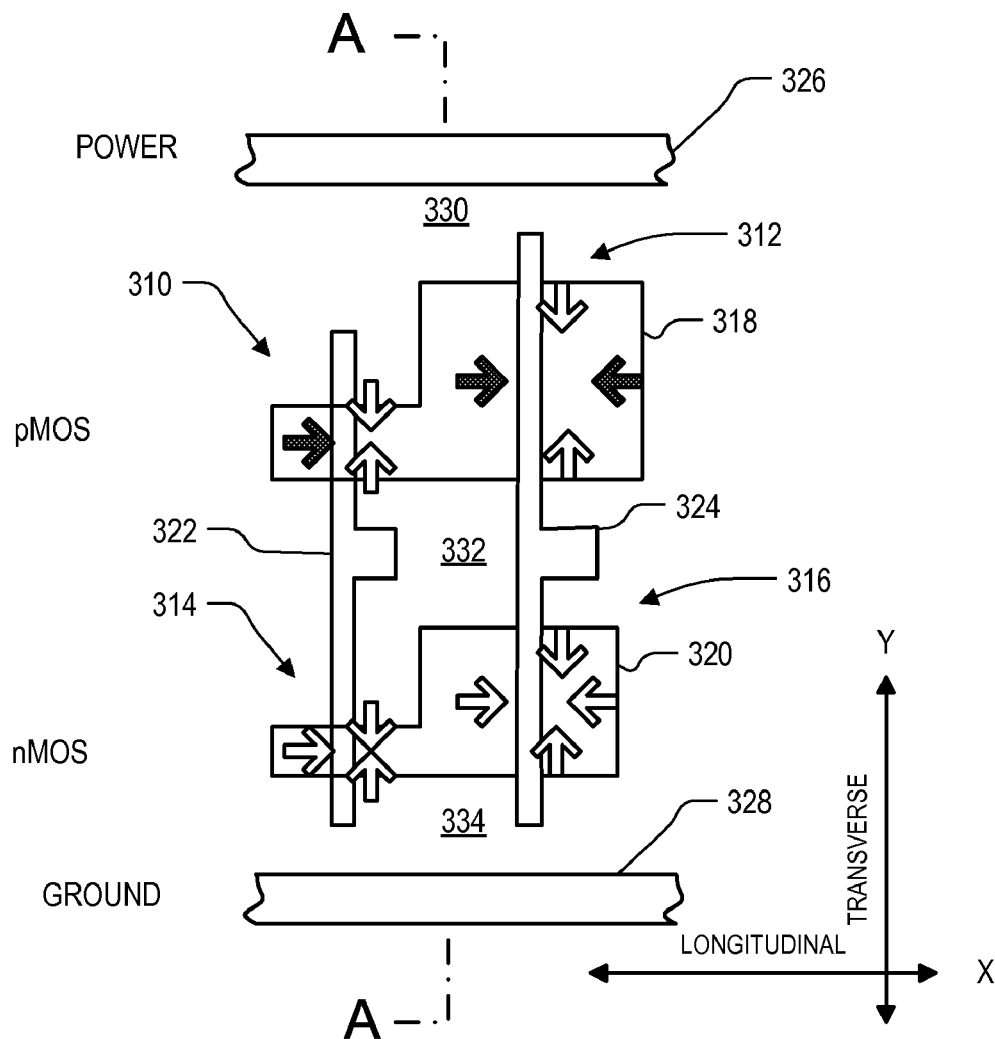
FIG. 3 illustrates a plan view of a typical layout region of an integrated circuit design.
Figure 3A:
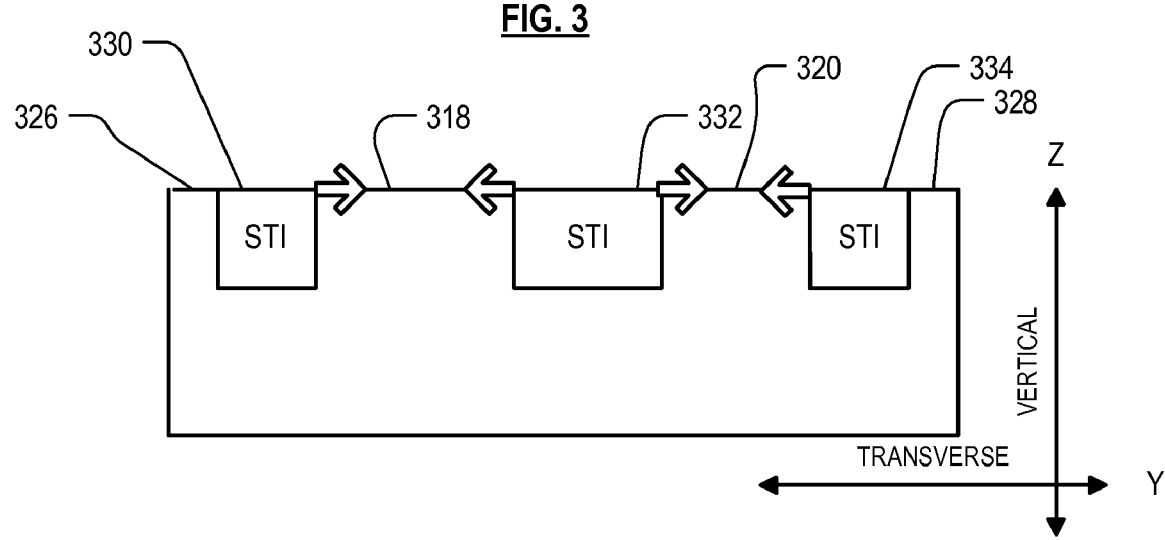
FIG. 3A illustrates a cross-section of a chip taken at sight-line A-A as shown in FIG. 3.

FIG. 3 illustrates a plan view of a typical layout region 300 of an integrated circuit design. FIG. 3A illustrates a cross-section of the resulting chip taken at sight-line A-A as shown in FIG. 3. Shown in FIG. 3 are two P-channel transistors 310 and 312, and two N-channel transistors 314 and 316. The two P-channel transistors share a diffusion region 318, and the two N-channel transistors share a different diffusion region 320. Each transistor has a channel which is defined by its diffusion region and a gate conductor which crosses the diffusion region. The drain and source regions of each of the transistors are the portions of the diffusion regions on opposite sides of the gate conductor, but whether one constitutes the source and the other the drain or vice-versa, depends on the circuit being implemented.

In typical CMOS fashion, to form a logical inverter element, the gate conductor crosses both a P-diffusion and an N-diffusion to define both a P-channel and an N-channel transistor. Thus in FIG. 3 a gate conductor 322 crosses both diffusion regions to define both transistors 310 and 314, and a gate conductor 324 crosses both diffusion regions to define both transistors 312 and 316. The channels of the transistors in a typical fabrication process are slightly different (from left-to-right in the figure) than the gate conductors themselves because of the addition of other components of the gate stack (not shown) such as spacers, and lateral diffusion of the source and drain dopants under the gate. As used herein, the term "region" represents a two-dimensional area in a plan view of the layout. Stress "in" a region is considered to be the stress close to the surface of the region, where current flows.

In the embodiments described herein, an approximation is made that the stress "in" a region is equal to the stress "at" the surface of the region. In another embodiment, stresses within a volume of the chip can be taken into account as well, including at depths below the surface.

As used herein and as shown in FIG. 3, the "longitudinal" direction of a transistor is the direction of current flow between source and drain when the transistor is turned on. The "transverse" direction is perpendicular to the longitudinal direction, and perpendicular to the direction of current flow. Both the longitudinal and transverse directions of the transistor are considered to be "lateral" directions, meaning a direction that is parallel to the surface. Other "lateral" directions include those (not shown) which are parallel to the surface but intersect both the transverse and longitudinal directions at angles. The "vertical" direction is normal to the surface of the channel and therefore perpendicular to all possible lateral directions. The "length" of a structure in the layout is its length in the longitudinal direction, and its "width" is its width in the transverse direction. It can be seen from the layout of FIG. 3 that the channel lengths are significantly shorter than their widths, which is typical for the transistors that are used in logic circuits. Also shown in FIGS. 3 and 3A are X, Y and Z coordinate axes of the layout. Primarily for lithographic reasons, it is common in logic circuit design that all transistors be oriented alike, and consistent with this convention, in the layout of FIG. 3, all four transistors are oriented such that the longitudinal direction of the transistors are in the X direction of the layout, and the transverse direction of the transistors are in the Y direction of the layout. The Z direction, visible in FIG. 3A, is perpendicular to both the X and Y directions, representing a depth into the integrated circuit chip.

Additionally, the term "region", as used herein, does not necessarily imply a physical boundary. That is, one "region" can contain multiple "sub-regions", which themselves are considered herein to be "regions" as well. Thus it is reasonable to refer to a region within a diffusion region, even one that has not been defined physically in any way. In FIG. 3A, more than one set of source and drain diffusions share a single overall diffusion region. In yet another embodiment, the source, drain and channel regions collectively are laterally co-extensive with the overall diffusion region. Also, in another embodiment, the source and drain diffusion regions might be made of different materials (e.g. SiGe) than the channel region (e.g. Si). In all of these cases it can be said that the source diffusion region forms "at least part of" a diffusion region, that the drain diffusion region forms "at least part of" a diffusion region, and that a channel region can exist even before it is defined physically.

FIG. 3 also illustrates power and ground diffusion buses 326 and 328, respectively. Typically metal rails overly these diffusion buses, and since the present discussion is concerned primarily with plan views of layout features, it makes little difference whether what is referred to is the diffusion bus or the metal rail. For convenience, therefore, both buses and rails are referred to herein simply as "conductors".

As can be seen from FIG. 3, the transistors and their diffusions are disposed laterally between the power and ground conductors. The power and ground conductors, as well as power supply conductors of any other voltage, are all sometimes referred to herein collectively as "power supply conductors".

Figure 4:
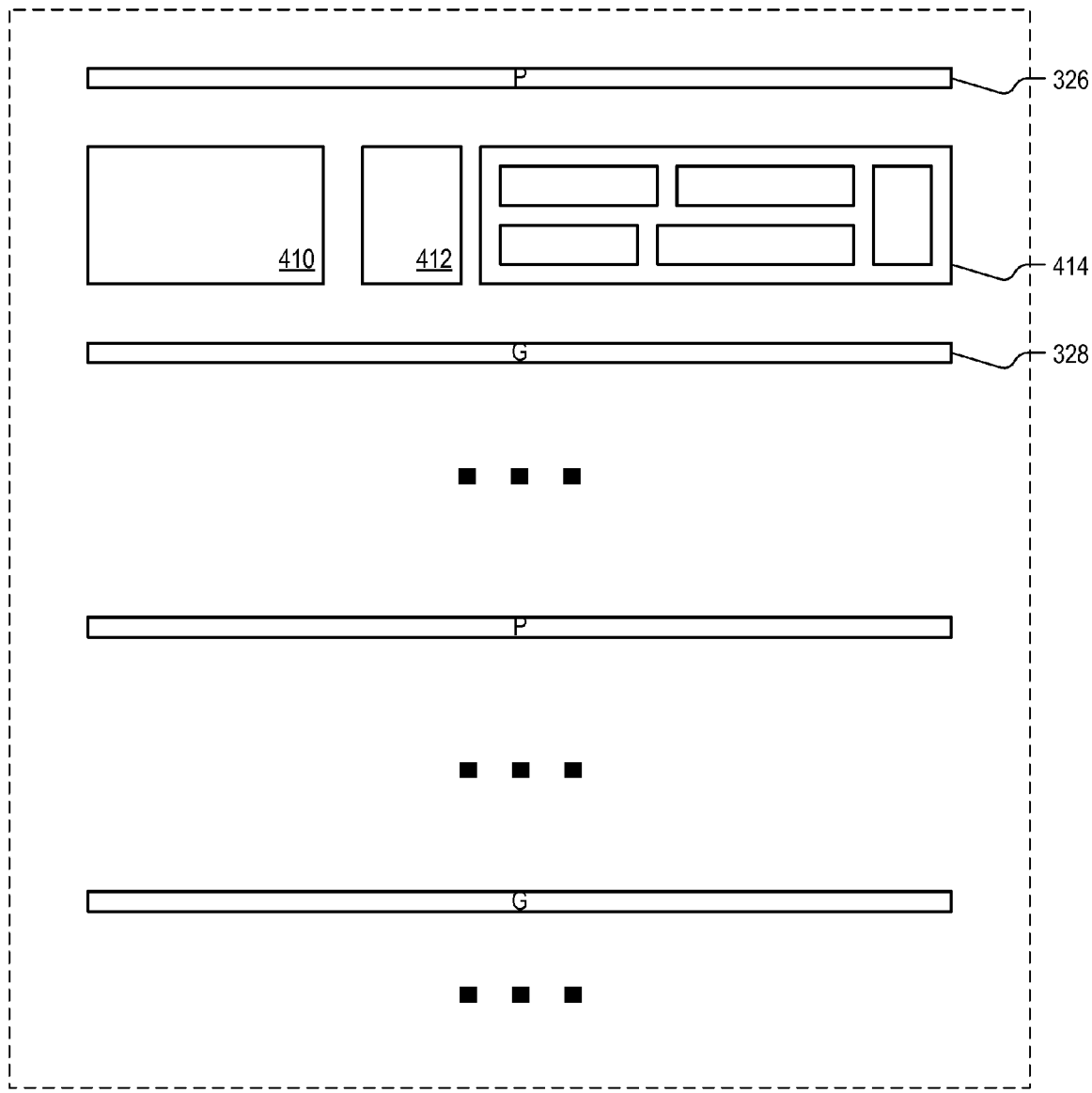
FIG. 4 illustrates a larger region of the layout of FIG. 3.

FIG. 4 illustrates a much larger region of the layout of FIG. 3. As shown in FIG. 4, this layout includes power supply rails (conductors) that extend across most or all of the chip in the X dimension. Such an arrangement is common, especially but not exclusively for ASICs, standard cells and FPGAs. The power supply conductors 326 and 328 (FIG. 3) are shown also in FIG. 4. In typical 2-voltage circuits (power and ground), the rails alternate power and ground in the Y dimension. The transistors of the logic circuitry are laid out in a strip between a pair of the rails, usually within individual cells or macrocells such as 410, 412 and 414 in FIG. 4. Typically the cells are all of the same size in the Y dimension but may vary in size in the X dimension. Cell 412, for example, contains the four transistors with two diffusion regions as shown in FIG. 3. Cell 414 in FIG. 4 represents diffusion regions as the smaller rectangles, and the regions between the rails and outside of the diffusion regions are STI regions containing oxide. All these STI regions conventionally exert compressive stress on the diffusion regions, including within the transistor channels, both longitudinally and transversely.

Returning to FIG. 3, arrows have been inserted to illustrates various components of the STI-induced compressive stress exerted on the four channel regions. It can be seen that stress is exerted both longitudinally and transversely. Some of the transverse stress components are also shown in FIG. 3A. As mentioned above, all such compressive stress components tend to degrade performance of the transistors except for longitudinal stresses on P-channel transistors 310 and 312, which tend to enhance performance. The performance enhancing stress components are indicated in FIG. 3 by darkened arrows. In particular, it is noteworthy that all transverse stress components are detrimental.

As mentioned above, in step 214 (FIG. 2), in one aspect of the invention, certain stress-related enhancements can be added to the layout without specific knowledge of the circuitry or device structures. Because all transverse stress components tend to degrade transistor performance, one such technique is to insert longitudinally-oriented stress relief trenches in the STI regions, spaced laterally from the transistor channels. This step can be taken based on specific knowledge of the actual locations of the device structures (as described in more detail hereinafter), but can also be taken without knowledge of the locations of device structures in circuits laid out according to the conventions shown in FIG. 4. That is, in a layout in which most transistors are located laterally in strips between power supply rails, and most transistors are oriented so that their longitudinal direction lies in the same direction as the orientation of the power supply rails, transverse stress can be relieved for most transistors in the layout by introducing a trench in the STI region laterally between the transistor diffusion regions and either or both of the power supply conductors, extending parallel to the power supply conductors.

Figure 5:
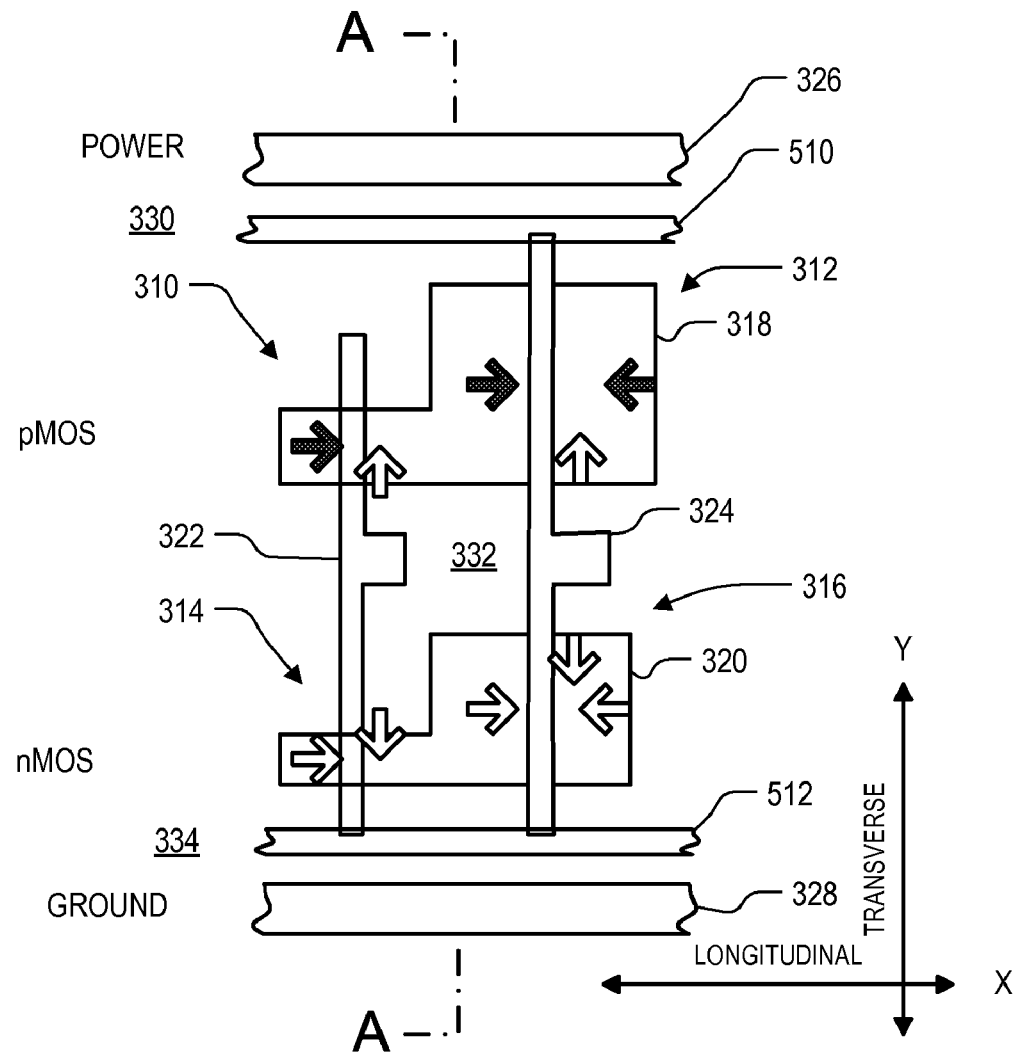
FIGS. 5 and 5A illustrate stress-adjustment modifications to the layout region of FIGS. 3 and 3A.
Figure 5A:
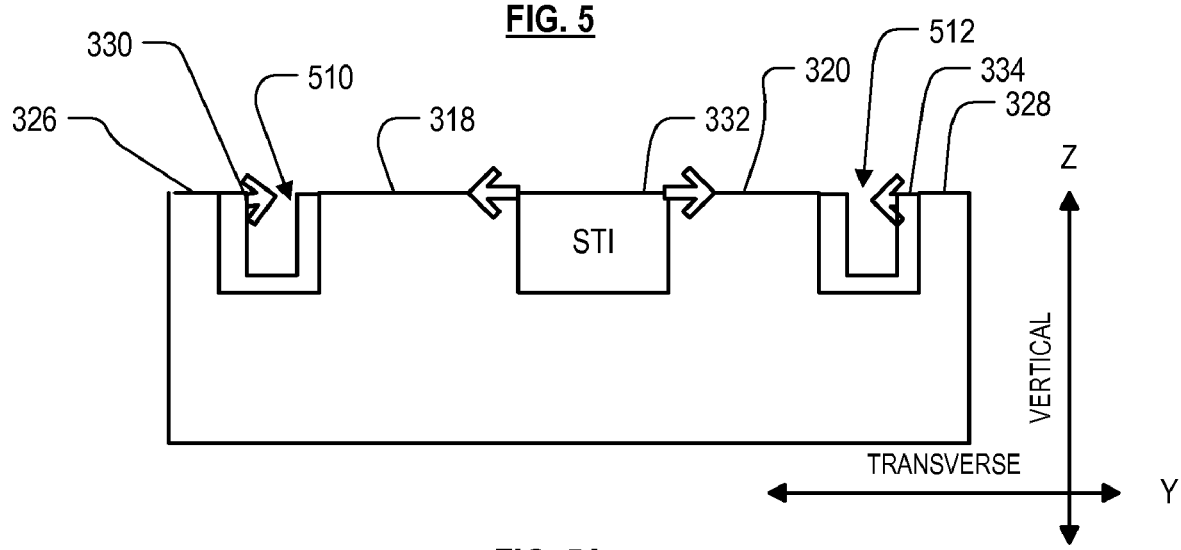
Figure 6:
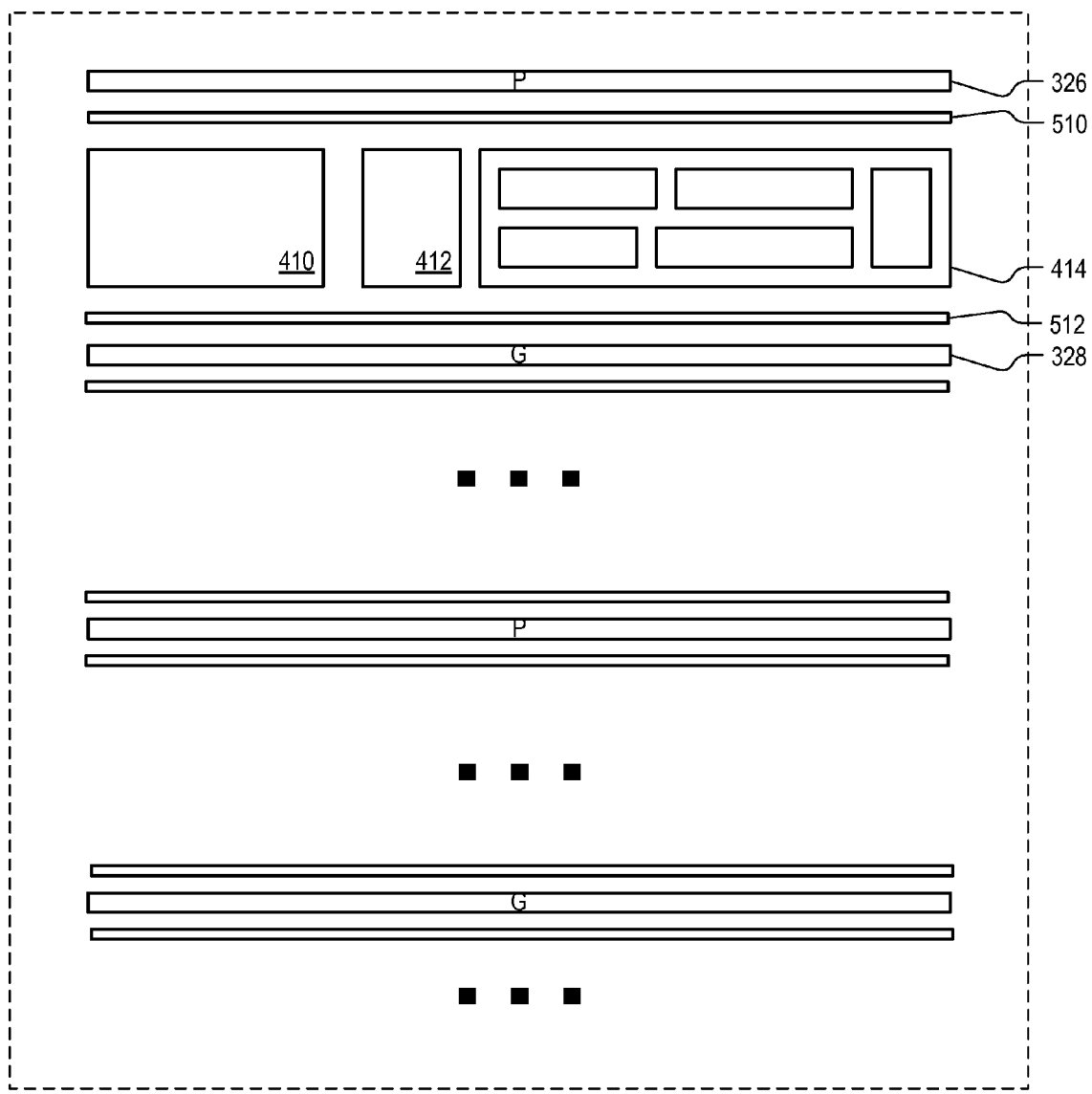
FIG. 6 illustrates stress-adjustment modifications to the layout region of FIG. 4.

FIGS. 5 and 5A illustrate such a modification to the layout region of FIGS. 3 and 3A. FIG. 6 illustrates the modification to the region of FIG. 4. As can be seen, a trench 510 has been inserted into the layout within the STI region 330, oriented in the X dimension, and disposed transversely between the diffusion region 318 and the power supply conductor 326. Similarly, another trench 512 has been inserted into the layout within the STI region 334, oriented in the X dimension, and disposed transversely between the diffusion region 320 and the power supply conductor 328. The transverse component of the STI-induced stress has been relieved, as indicated by the absence of those arrows in the Figure. Not all transverse stress is relieved, but the improvement can nevertheless be significant and the technique can be applied as a matter of course, without specific knowledge of the circuit design or the layout. Moreover, since the trenches do not alter the integrated circuit design in any way, there is no need to pass the design through software for a new layout.

The trenches 510 and 512 can be etched at the end of the front-end fabrication process, after all the high temperature steps are completed. The trenches can be of any width (in the X dimension), since their only purpose is to relieve stress. Preferably they are made as narrow as the fabrication technology will allow. They are also preferably as deep as possible without, however, breaking through the STI into the silicon below. However, having its depth as small as ⅔ or even ⅓ of the STI depth is often sufficient to relax most of the harmful stress. It is also easy to extend the trenches along the full length of the power supply lines as shown in FIG. 6. However, since the beneficial effect of the trenches is felt most substantially (though not exclusively) from only those portions directly alongside a diffusion region such as 318 or 320, it is still possible to obtain significant performance enhancement by implementing stress relief trench segments, only alongside one or more of the diffusion regions. Significant performance enhancement can also be obtained even if the trenches are limited to segments disposed directly transverse to the channel regions. The layout will benefit from this technique also if trenches are disposed along only one of the two power supply conductors bordering a strip of cells, although trenches along both power supply conductors are preferred.

The descriptions herein of the stress impact on transistors and of the methods to use stress to improve transistor performance apply to what are presently the standard crystallographic orientations used in the semiconductor industry, with the (100) wafer surface and <110> channel direction. The stress distribution changes only slightly for alternative possible crystal orientations of the wafer and the transistor channel, but the impact of stress on carrier mobility can change significantly not only in magnitude, but also in sign. Therefore, the described methodologies can be still applied to an arbitrary crystal orientation of the wafer and the transistors, but the type and location of the stress-improving trenches, dummy features and other techniques will need to be adjusted for each specific case. The same is true for alternative semiconductors like germanium and compound semiconductors like GaAs, InP, SiC.

In one embodiment, the STI material can be formed as an oxide (for example a thermally grown oxide) on the walls and bottom surfaces of the STI trenches, a nitride liner formed on the thermal oxide, and a second oxide (for example TEOS) filling the remainder of the trenches above the nitride liner. The second oxide can be then etched to form the stress-reduction trenches, with the nitride liner ensuring that the trenches do not go deeper than the STI.

The stress relief trenches 510 and 512 may be filled with any material, but preferably a dielectric material rather than a conductor. Also the fill material should not be one that will not re-introduce the stress that the trench was introduced in order to relieve. Preferably a low temperature fill, such as TEOS deposited at low temperature, is used in order to avoid new stresses created by the downward temperature ramp. Another suitable fill material is a low-k dielectric such as that used for interconnects. For both low temperature TEOS and low-k dielectrics, use of these materials to fill stress relief trenches does not require additional process steps because these materials are deposited anyway before application of the first metal layer. Yet another satisfactory fill material is a nitride which has little thermal mismatch with silicon.

Even more preferably, however, the trenches are filled with a material that introduces tensile, as opposed to compressive stress in the transverse dimension. For example, a strained material such as commercially available strained silicon nitride can be used. For narrow trenches, such a material can be deposited over the entire wafer, thereby filling the trenches and leaving a thin layer over the rest of the wafer. The silicon nitride material outside the trenches can then be removed by a wet etch, or by a dry etch with the trench regions masked, or by chemical-mechanical-polishing (CMP), or by other methods that will be apparent to the reader. The extra process steps required by the filling of the trenches with a stained material may be most justifiable for high performance or high margin integrated circuit products. Alternatively, in fabrication processes that already use tensile nitride as cap overlayer to boost performance of nMOSFETs, the material can be deposited in the trenches during the same process step.

Returning to FIG. 2, in addition to layout revisions to incorporate any circuit insensitive stress enhancement techniques, a series of steps also can be taken which apply stress-enhancement techniques that do depend on the circuit design and current layout. In general, the application of these techniques take the overall form of a step 216, in which the stress impact on a transistor performance parameter is analyzed, followed by a step 218, in which it is determined whether the stress-adjusted performance parameter matches the target value for that parameter. If not, then in step 220 the layout is revised according to one or more stress-enhancement techniques, and the method loops back to step 216 for re-analysis. The sequence of steps can be performed iteratively until the value(s) of one or more performance parameters are deemed satisfactory.

The stress analysis can be performed by any desired method, including full TCAD simulation. The LOD method can be used, but is not preferred because of its inherent inaccuracies. Most preferred is the method described in the above-incorporated "Analysis of Stress Impact on Transistor Performance" Patent Application, because it can be made to operate with sufficient speed to analyze the transistors in large layout regions in multiple layout revision iterations, and with sufficient accuracy. Roughly described, that method involves, for each transistor to be analyzed, first selecting several sample points in the transistor's channel. The stress vector at each of the sample points is then approximated, and the impact on a transistor characteristic of interest, such as the stress-induced change in mobility at the particular sample point, is determined. The values of these characteristics are then averaged over all the sample points in the channel to approximate the average stress-adjusted value for the entire channel.

The transistor performance parameter referred to in steps 216 and 218 is any parameter of a transistor that can then be used in circuit level simulations, such as SPICE. Examples include electron mobility, Ion, and transistor switching speed. In addition, as used herein, a "parameter" is considered merely a slot or container. It is not itself a value. However, in a particular circuit or structure, a parameter can have a value. The present discussion refers to such a value as the "value" of the particular parameter.

In step 220, a number of different techniques are available to revise the layout to account for stress modification of the performance parameter. In one aspect, the transistor channel widths can be adjusted to better match the strength ratios intended by the designer. More particularly, referring to FIG. 3, it can be seen that the channel width of transistor 312 is approximately 3 times the channel width of transistor 310, and similarly the channel width of transistor 316 is approximately 3 times the channel width of transistor 314 (drawings are not to scale). Since transistor strength (Ion) is roughly proportional to channel width/length (absent stress considerations), and since the channel lengths are all the same (as is typically the case), it appears that the designer intended the Ion for transistor 312 to be 3 times that of transistor 310. Similarly, it appears that the designer intended the Ion for transistor 316 to be 3 times that of transistor 314. This strength ratio of 3:1 is referred to herein as a target ratio, and before stress effects are taken into account, results in the 3:1 channel width ratio on the layout. The analysis in step 216, however, may indicate that actual strength ratio is significantly different than 3:1 once stress effects are considered. In step 220, therefore, the designer can either increase the channel width (i.e. the diffusion width) of one of the transistors, or decrease the channel width of the other, or a combination of both, in order to achieve the target strength ratio of 3:1. The method then returns to step 216 to re-analyze the stress-adjusted ratio of the values of Ion. Further layout revisions may be performed thereafter, in iterative fashion until the Ion ratios, as well as the values of any other transistor performance parameters of interest, are within acceptable ranges of their target values.

Note that often it will be insufficient to modify the channel widths of only the particular transistors being addressed. Increased channel width also causes increased capacitance, often requiring upstream driving circuitry to be strengthened to accommodate. On the other hand, decreased channel width weakens the driving ability of the transistor, which may require adjustment of downstream circuitry. Therefore, after the layout revisions are made, it is advisable to calculate new SPICE model parameters for the affected transistors and re-run the circuit simulations to ensure that the circuit still will operate as intended.

Figure 7:
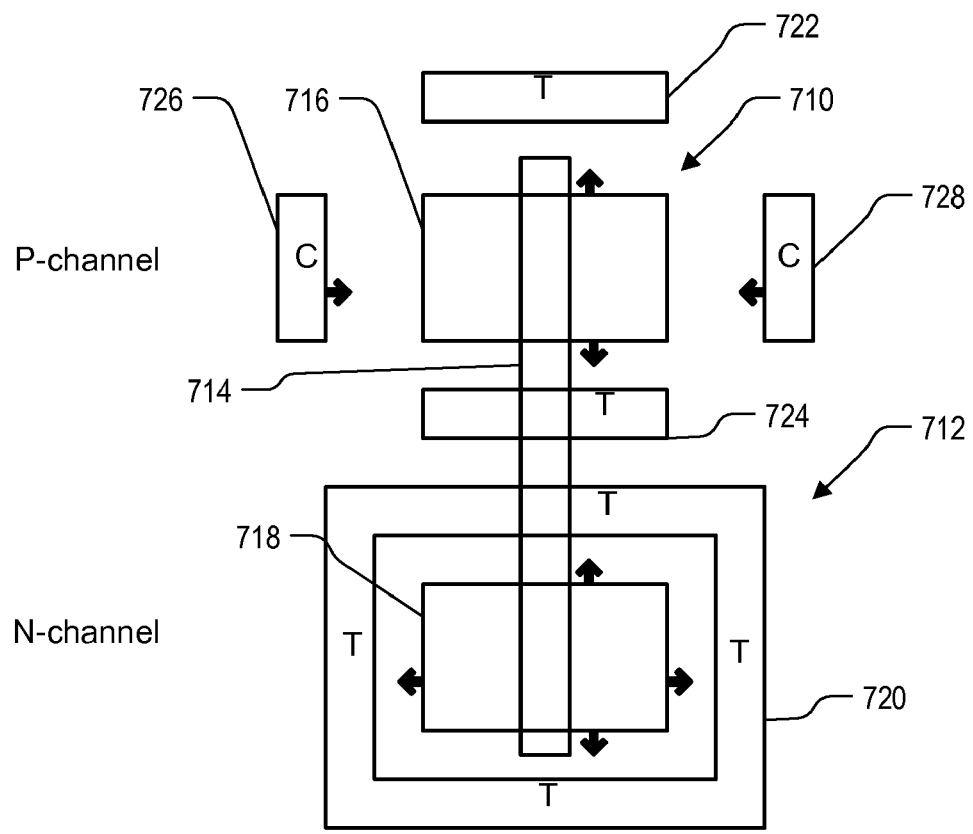
FIGS. 7 and 8 illustrate sample layout region in which trenches have been added.

A second technique that can be used to revise the layout to account for or counteract stress modification of a performance parameter in step 220, involves introducing dummy features at strategic locations in the layout. These dummy features are not electrically connected to the circuitry, thereby avoiding any necessity to re-layout the design after stress-related layout revision. In one embodiment, the dummy features are trenches, optionally filled with compressive or tensile strained material as required either to reduce undesirable stress or increase desired stress. FIG. 7 illustrates one sample layout region in which such trenches have been added. The layout defines a P-channel transistor 710 and an N-channel transistor 712 sharing a common gate conductor 714. Transistor 710 has a P-channel diffusion 716 and the transistor 712 has an N-channel diffusion 718. As previously pointed out, compressive stress degrades N-channel transistor performance regardless of the direction. Therefore, the layout of FIG. 7 has been modified by adding a trench 720 completely surrounding the N-channel diffusion 718. By itself, this trench should reduce stress (at least STI-induced stress) on the diffusion region 718 and thereby improve transistor performance. In addition, in the embodiment depicted in FIG. 7, the trench 720 has been filled with a tensile strained material such as tensile nitride. As a result, stress in the diffusion region 718 is affirmatively reduced, even to the point of being tensile, thereby improving performance of the transistor even further.

With respect to the P-channel transistor 710, as previously pointed out, compressive stress in the transverse direction degrades P-channel transistor performance but compressive stress in the longitudinal direction improves P-channel transistor performance. Therefore, two trenches 722 and 724 have been added to the layout of FIG. 7, oriented longitudinally and spaced transversely on either side of P-channel diffusion region 716. These trenches have been filled with a tensile strained material to further apply tensile stress on the diffusion region 716 transversely. In addition, two more trenches 726 and 728 have been added to the layout of FIG. 7, oriented transversely and spaced longitudinally on either side of P-channel diffusion region 716. These trenches have been filled with a compressive strained material such as compressive nitride or compressive TEOS, to further apply compressive stress on the diffusion region 716 transversely. Both of these layout modifications tend to improve performance of transistor 710.

Note that in an embodiment, the layout modifications of FIG. 7 can be performed as a matter of course for all (or many) N-channel and P-channel transistors in a layout, outside of the iteration loop of steps 216, 218 and 220 if desired. Also, in an embodiment, stress-adjustment trenches, whether or not filled with tensile or compressive strained material, can be given varying depths. Control of trench depth adds additional designer flexibility because deeper trenches tend to affect stress over greater lateral distances, whereas the stress effects of shallower trenches tend to be more localized. Designer flexibility can be enhanced also by using two or more different fill materials having different strains in different trenches. For example, fill materials that can be used include commonly available pre-strained nitride with various compressive strains of up to −2.5 GPa, and with various tensile strains of up to +1.5 GPa. Thus, for example, if certain regions of a layout are determined to be under undesirable high tensile stress, stress can be made more neutral in these regions by adding appropriately disposed deep trenches filled with −2.5 GPa compressive nitride. If certain regions of a layout are determined to be under low but still undesirable tensile stress, stress can be made more neutral in these regions by adding appropriately disposed shallow trenches filled with compressive TEOS. Similarly, if certain regions of a layout are determined to be under undesirable high compressive stress, stress can be made more neutral in these regions by adding appropriately disposed deep trenches filled with +1.5 GPa tensile nitride; and if certain regions of a layout are determined to be under low but still undesirable compressive stress, stress can be made more neutral in these regions by adding appropriately disposed shallow trenches filled with 0.5 GPa tensile nitride. Many other variations will be apparent.

Figure 8:
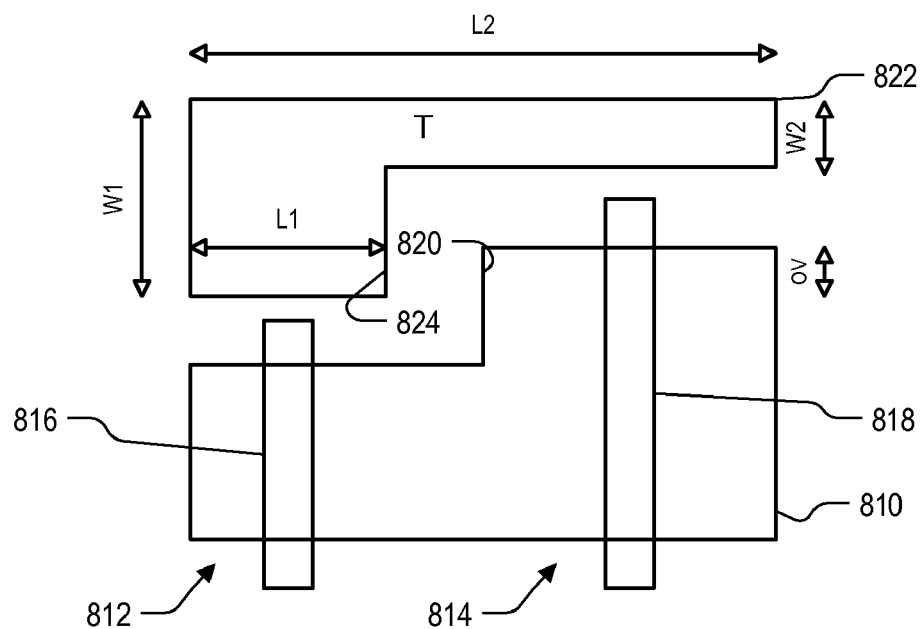

FIG. 8 illustrates that the trenches added to a layout in order to modify it for stress considerations need not be simple rectangles as in FIGS. 5, 6 and 7. In FIG. 8, the trench is shaped in a manner complementary to the target diffusion region, to improve its effect further. In particular, a diffusion region 810 contains two transistors 812 and 814, defined by the diffusion region in conjunction with gate conductors 816 and 818, respectively. Transistor 814 has a larger channel width than transistor 812, so the diffusion region transitions from a narrower width to a wider width at an edge 820, at a position that is longitudinally between the two channel regions. A trench 822 has been added to the layout, oriented longitudinally and spaced transversely from the diffusion region 810. In the embodiment, the trench 822 has been filled with a tensile strained material. The trench is wider adjacent to the narrower transistor 812 than it is adjacent to the wider transistor 814, and it transitions from its wider width W1 to its narrower width W2 at an edge 824 of the trench 822. In this way, trench 822 has approximately the same lateral spacing from the channel regions of both transistors 812 and 814, whereas a simple rectangular trench might have to be spaced farther from the channel of transistor 812 than from the channel of transistor 814. A narrower spacing between the trench 822 and the channel of transistor 812 tends to improve the beneficial effect of the trench, since stress falls off as a function of distance. The wider trench near the channel of transistor 812 also helps improve the performance of transistor 812 since the greater transverse width of tensile strained fill material imposes greater tensile stress on such channel.

In the layout of FIG. 8, the longitudinal dimension L2 of the trench 822 should preferably be as long as possible. However, since the most benefit derives from portions of the trench directly transversely spaced from each channel region, one embodiment includes such a trench only directly transversely spaced from each channel region. In addition, it can be seen that in the layout of FIG. 8, the trench 822 extends transversely into the cutout left by the diffusion region 810 when it transitions from the wider channel width to the narrower channel width at edge 820, so that the trench 822 and the diffusion region 810 overlap in the transverse dimension by a distance indicated 'OV' in the drawing. At least the overlapping portion of the tensile filled trench 822 will therefore apply tensile stress longitudinally on at least the overlapping portion of the diffusion region 810. For N-channel transistors, this is beneficial, so OV should be made large if possible. For P-channel transistors this is detrimental, so OV should be kept small if possible. Regardless of the transistor type, it will be advantageous to optimize the positions and shapes of the trenches by iterative "what-if" evaluation of various configurations in the loop of steps 216, 218 and 220 (FIG. 2). The depth of the trenches and the fill material can also be optimized during these iterations, based on the general rules described above.

It can be seen that introducing dummy trenches at strategic locations and with strategic shapes and fills in the layout during the iterative layout revisions of steps 216, 218 and 220 can improve performance of the transistors targeted by these techniques. One or more additional lithography steps may be incurred in order to implement this aspect of the invention. However, the additional lithography steps can be avoided in fabrication technologies that include the use of silicon germanium source and drain regions for P-channel transistors. Silicon germanium is a more compressively strained material than STI, so trenches oriented transversely and spaced longitudinally from the ends of P-channel diffusions, such as in regions 726 and 728 of FIG. 7, can be filled with silicon germanium in order to introduce compressive stress longitudinally into the channel. Similarly, the additional lithography steps can be avoided also in fabrication technologies that use carbon doped silicon, which is a tensile strained material. Thus carbon doped silicon may be used to fill trenches such as 722, 724, 720 and 822 in FIGS. 7 and 8, often without incurring the cost of additional lithographic steps. Note that both silicon germanium and carbon doped silicon are electrically conductive, whereas strained silicon nitride is not. Unlike trenches filled with strained silicon nitride, therefore, the locations of trenches filled with silicon germanium or carbon doped silicon should be taken into account when routing the interconnects.

In a third technique for revising the layout to account for stress modification of a performance parameter, dummy diffusion regions are added in the STI regions of the layout instead of or additionally to the adding of dummy trenches. Many of the same principles apply to the locations and shapes of such dummy diffusion regions as set forth above with respect to the locations and shapes of stress relief trenches filled with stress-neutral material. The use of dummy diffusion regions may not be as flexible as the use of trenches filled with strained materials, but no additional process steps are required. These dummy diffusions preferably are placed as close as possible to the transistor diffusions in order to maximize their effectiveness for stress reduction. Preferably they are spaced from a transistor diffusion by no more than one or two times the minimum STI width specified for the fabrication process.

In yet a fourth technique for revising the layout to account for stress modification of a performance parameter, diffusion regions containing more than one P-channel transistor longitudinally can be split between transistors. This has the effect of introducing an STI region longitudinally between the two diffusions, thereby introducing beneficial compressive stress into the channel regions of both. Typically it is not desirable to split shared diffusion regions as a matter of course, since this technique usually increases the amount of chip area required to implement the circuit. But the tradeoff may be worthwhile for selected transistors, such as those in a critical path, or it may be worthwhile for most or all P-channel transistors in high performance or high margin products.

Figure 15:
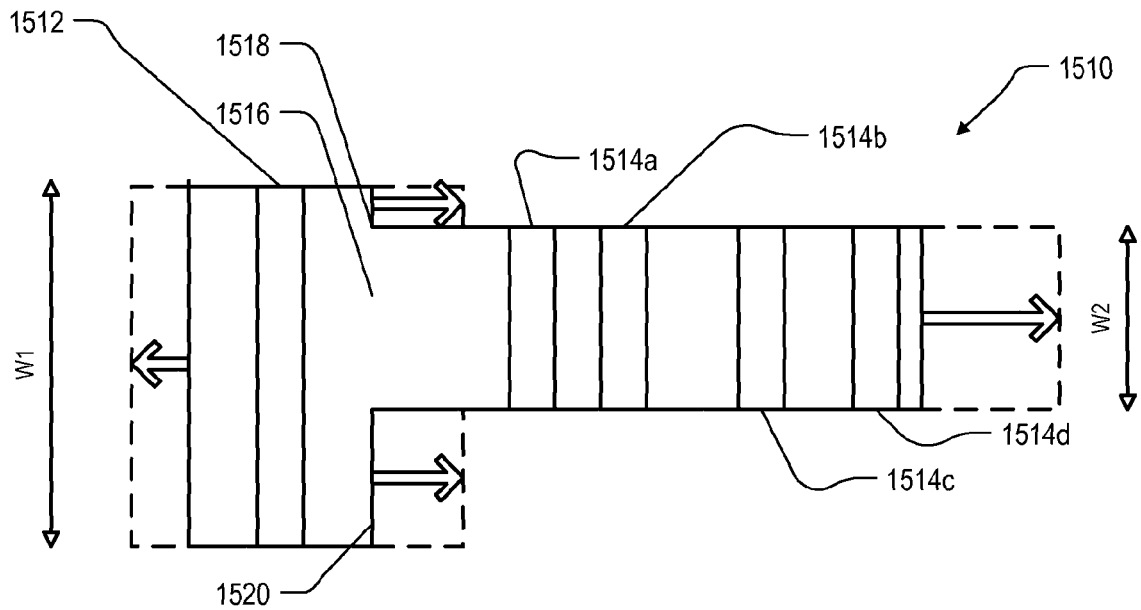
FIG. 15 illustrates a plan view of a particular layout region, and a revision of that layout region in an aspect of the invention.

Yet a fifth technique for revising the layout to account for stress modification of a performance parameter is illustrated in FIG. 15. FIG. 15 illustrates a layout region 1510 having five transistors represented by channel regions 1512, 1514a, 1514b, 1514c and 1514d, all in a single diffusion 1516. The transistor 1512 has a channel width w1 and is located in a wider segment of the diffusion region 1510 than the transistors 1514a, 1514b, 1514c and 1514d (collectively 1514), which all have a channel width w2. The diffusion 1516 transitions from the wider width to the narrower width at top and bottom transition edge 1518 and 1520, respectively.

According to this fifth technique, the lengths of diffusion regions can be changed in a longitudinal direction without changing the widths. Typically these changes will involve extending rather than contracting the diffusion lengths, in a direction away from the channel regions. Thus as illustrated in FIG. 15, the left edge of diffusion region 1516 is extended toward the left (as illustrated by the dashed lines and an arrow pointing in the direction of extension), and the right edge of diffusion region 1516 is extended toward the right. Additionally, the transition edges 1518 and 1520 are moved toward the right, which is away from the transistor 1512 that they affect, but not so far toward the right so as to enlarge the channel width of the left-most narrow transistor 1514a.

If the diffusion region 1516 is entirely silicon, then extending it longitudinally away from the channel regions has the effect of reducing STI-induced compressive longitudinal stress on the channel regions. This is beneficial for N-channel transistors only, and therefore in an embodiment, the technique is used only on N-channel diffusions. If the diffusion region 1516 contains SiGe in the source and drain portions, or contains another material that causes compressive stress longitudinally into the transistor channels, then extending the regions longitudinally away from the channel regions has the effect of increasing compressive longitudinal stress on the channel regions. This is beneficial for P-channel transistors only, and therefore in an embodiment, the technique is used only on P-channel diffusions containing a compressively stressed material in the source and drain regions. Commonly, however, N-channel diffusions on a chip are made of silicon while P-channel diffusions on the same chip contain SiGe source and drain regions. In this situation extending the diffusion regions longitudinally away from the transistor channel regions would be beneficial for both the N-channel and the P-channel transistors.

A layout revision according to this fifth technique does not require iteration back to the circuit design, since so long as the channel widths remain unchanged, so do the load capacitances.

Figure 16:
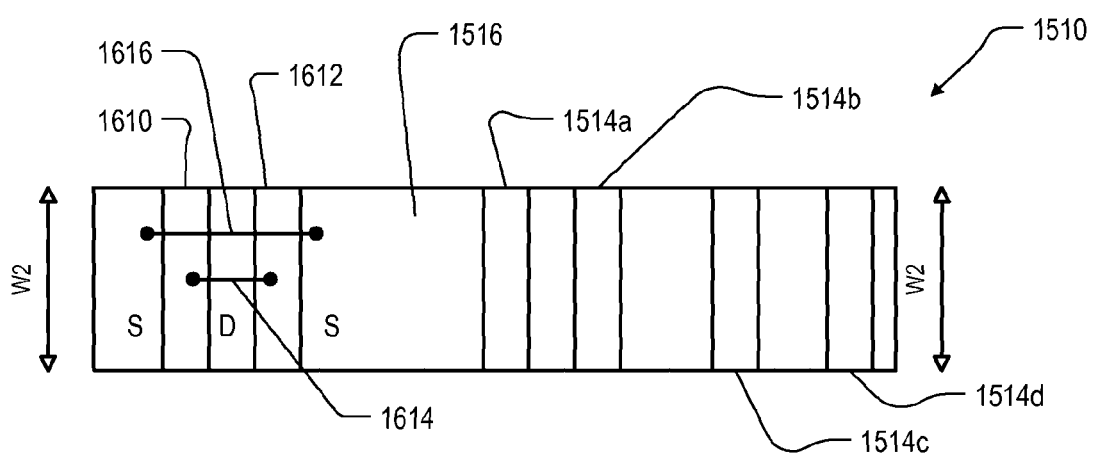
FIG. 16 illustrates the layout region of FIG. 15, revised according to a different aspect of the invention.

Yet a sixth technique for revising the layout to account for stress modification of a performance parameter is illustrated in FIG. 16. FIG. 16 illustrates the layout region 1510 of FIG. 15, revised according to this sixth technique. In this sixth technique, all transistors are given the same channel width by replacing wider transistors with an appropriate number of parallel-connected narrower transistors. In the layout region of FIG. 15, for example, transistor 1512 has twice the width as each of the transistors 1514 (w1=2*w2). In the revised layout of FIG. 16, therefore, transistor 1512 has been replaced by two parallel-connected transistors 1610 and 1612, each having width w2. The two replacement transistors 1610 and 1612 are connected in parallel by connecting the gate of transistor 1610 to the gate of transistor 1612 and the source of transistor 1610 to the source of transistor 1612, as shown symbolically in FIG. 15 by interconnects 1614 and 1616, and by positioning them to share a common drain. Other means of parallel-connecting the replacement transistors will be apparent to the reader.

It will be appreciated that since transistor 1512 was designed with twice the width as transistors 1514, the designer appears to have intended that transistor 1512 have twice the Ion as each of the transistors 1514. Because of stress effects, however, that designer intent will not be fulfilled as originally laid out. By replacing the transistor 1512 with two parallel-connected transistors of half the width as transistor 1512, and of the same width as transistors 1514, the layout revision yields a combined Ion of the replacement transistors equal to twice the Ion of each of the transistors 1514, as apparently intended by the designer.

If the layout contains two transistors having widths that are not integer multiples of each other, this sixth technique can still be applied if both transistors are replaced by a respective set of parallel-connected transistors. The intended ratio of Ions will be achieved if all the replacement transistors have the same width, and if the ratio of the number of transistors replacing the first transistor to the number of transistors replacing the second transistor is equal to the ratio of the channel width of the first transistor as originally laid out, to the channel width of the second transistor as originally laid out. For example, if transistor A and transistor B are originally laid out with widths in the ratio of 3:2, then transistor A can be replaced by 3 parallel-connected transistors and transistor B can be replaced by 2 parallel-connected transistors, all of the same width. The technique can easily be extended to include replacement of multiple transistors as originally laid out, with multiple corresponding sets of parallel-connected narrower transistors.

It will be appreciated also that the revision of transistor widths such that all (or most) transistors in the overall layout have the same width, can substantially improve stress uniformity and layout insensitivity. It therefore may be desirable to revise layouts according to this sixth technique whenever possible, even without simulating actual stress-induced variations caused by different designed transistor widths.

In addition to the six techniques described above, it will be appreciated that other techniques can also be used to revise the layout in step 220 in response to stress effects. In addition, several of the techniques are compatible with each other, such that more than one of them can be used in a single layout or layout region.

After one or more such techniques are applied in the loop of steps 216, 218 and 220, and the stress-adjusted values of all target transistor performance parameters are satisfactory, the user can proceed to subsequent steps of the EDA process such as analysis and extraction step 124, and so forth (step 222). As used herein, a layout revised for stress effects is sometimes referred to herein as having been formed "in dependence upon" the automatically-generated layout from step 212. As used herein, a given layout is formed "in dependence upon" a predecessor layout if the predecessor layout influenced the given layout. If there is an intervening step or time period, or if there are other steps performed between the step 212 layout and the given layout, the given layout can still be "in dependence upon" the predecessor layout. If the intervening step combines more than one layout, the given layout is considered to have been formed "in dependence upon" each of the predecessor layouts.

At this point it should be noted that the introduction of stress modifications into a layout can be beneficial even where transistor performance is not improved, because a benefit can be obtained merely by removing or reducing the sensitivity that transistor performance otherwise has to its positions and surroundings in a particular layout. For example, if a minor change in the circuit design causes a particular transistor to be positioned differently in the resulting layout, and if the stress effects then cause the transistor's Ion value to depend on its position and its neighborhood in the layout, then the minor change in the circuit design might produce unintended results after the layout step. This can require the designer to revisit upstream steps in the EDA process of FIG. 1 to correct the unintended consequences. The corrections then applied in the circuit design might again produce unintended consequences after layout, requiring the designer to change the circuit design yet again, and so on. A stress modification step that reduces the sensitivity of transistor performance to its position in the layout, therefore, can be beneficial by helping to isolate the circuit design step from the layout step, thereby reducing the need to revisit upstream EDA steps. Accordingly, in another embodiment, decision step 218 in FIG. 2 can be replaced by a decision step asking whether the stress-modified layout removes a layout-induced variation in transistor performance.

The removal of layout sensitivity is beneficial especially in the context of standard cells, because layout-dependent stress can cause timing variations from instance to instance of the same cell depending on the cell placement and its neighborhood. A premise of standard cell design is that optimally the same cell design and layout can be used and re-used, wherever desired and without adjustments made internally to account for the context of its use. Some or all of the above techniques can therefore be used in standard cell layouts in order to isolate the cell from external stress influences. In particular, for example, dummy diffusions or trenches can be added along cell boundaries and/or along power supply conductors to reduce stress interaction of internal transistors from outside stress sources. Some dummy diffusion structures can be formed simply as extensions of well taps. Others can be turned into antenna diodes, effectively re-using chip area otherwise used for an external antenna diode. Dummy diffusions and trenches disposed alongside power supply conductors as shown in FIGS. 5 and 6 can also help isolate the cell from external stress influences.

Figure 9:
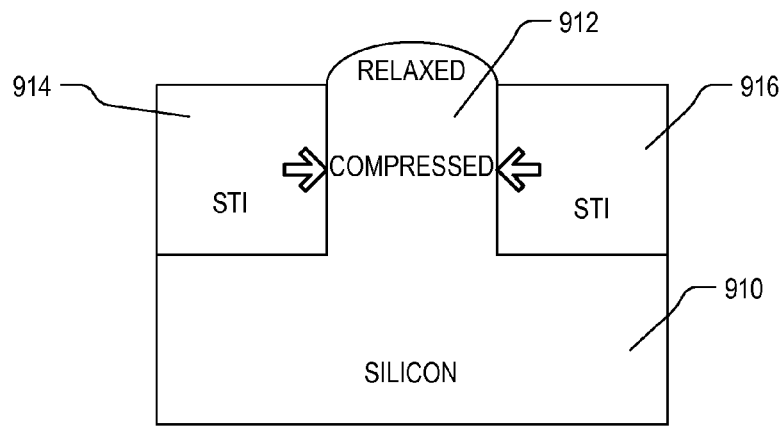
FIG. 9 is a symbolic cross-sectional view of a transistor in which the channel is elevated above the level of adjacent STI material.

Yet another stress management technique involves elevation of the transistor channel regions above the level of the adjacent STI material, as shown symbolically in FIG. 9. As shown in FIG. 9, a device includes a silicon substrate 910, into which a diffusion well 912 has been formed. STI regions 914 and 916 bracket the well 912 in at least the transverse dimension, as that dimension is defined by one or more transistor channel regions not shown in FIG. 9 but within the diffusion 912. Thus in FIG. 9, the longitudinal direction extends perpendicularly to the page. It can be seen that the diffusion region in FIG. 9 has been elevated relative to the STI transversely-adjacent regions. Stated another way, the transversely-adjacent STI regions have been suppressed relative to the diffusion region. The elevation differential causes the compressive stress induced by the STI regions on the diffusion region to be felt mostly at some depth below the surface of the diffusion region, allowing the surface of the diffusion region, where most of the current flows, to remain relaxed. This stress-management technique can be used either instead of or in addition to other techniques set forth herein, but when used, other techniques are likely to be less effective and less useful since undesirable STI-induced stress is already reduced by the elevation differential.

Figure 10:
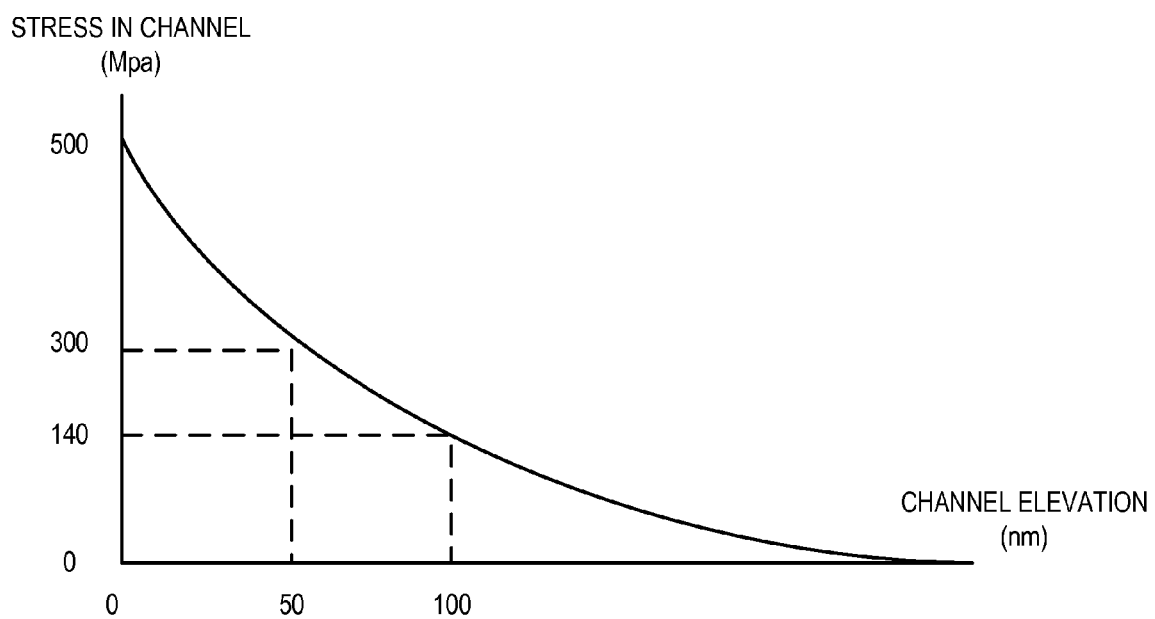
FIG. 10 is a representative plot illustrating the amount of stress near the surface of a channel region that is elevated by various amounts relative to the STI regions.

FIG. 10 is a representative plot illustrating the amount of stress near the surface of a channel region that is elevated by various amounts relative to the STI regions. It can be seen that if the stress in the channel with no elevation is 500 MPa, then the stress in the channel with an elevation of 50 nm is reduced to only 300 MPa, a 40% reduction. At 100 nm elevation, the stress in the channel is reduced to only 140 MPa, more than a 70% reduction in stress. Neither elevation is too large to achieve using conventional fabrication techniques, but it can be seen that even a 10 nm elevation will reduce the stress in the channel somewhat.

As previously described, transverse compressive stress generally degrades transistor performance for both N-channel and P-channel transistors, while longitudinal compressive stress generally degrades transistor performance only for N-channel transistors. For P-channel transistors, longitudinal compressive stress generally improves performance. Therefore, it is advantageous to suppress the STI regions as shown in FIG. 9 in all directions bordering an N-channel diffusion, but it is advantageous to suppress the STI regions only at the longitudinal borders of P-channel diffusions. At the transverse borders of P-channel diffusions, it is advantageous to allow the STI elevation to remain equal to or higher than that of the channel regions.

As used herein, the "elevation" of a structure refers to the elevation of its top surface. Note that it is elevation relative to channel regions specifically, rather than the entire diffusion, that is most significant. However, in many fabrication processes it is easier to elevate the entire diffusion region relative to the STI. Elevation of "the channel region", as used herein, therefore does not preclude elevation of regions larger than the channel region itself, up to and including the entire diffusion region of which it is part. Also, it can be seen in FIG. 9 that the corners of the diffusion region 912 adjacent to the STI regions 914 and 916 have been rounded. This practice is optional, but suggested in order to minimize undesired concentrations of electrons and holes in the corners. When used, the practice results in elevations that are not constant over the entire diffusion region. Therefore, as used herein, it is the average elevation over the entire channel region that is considered to determine the "channel elevation".

Figure 11:
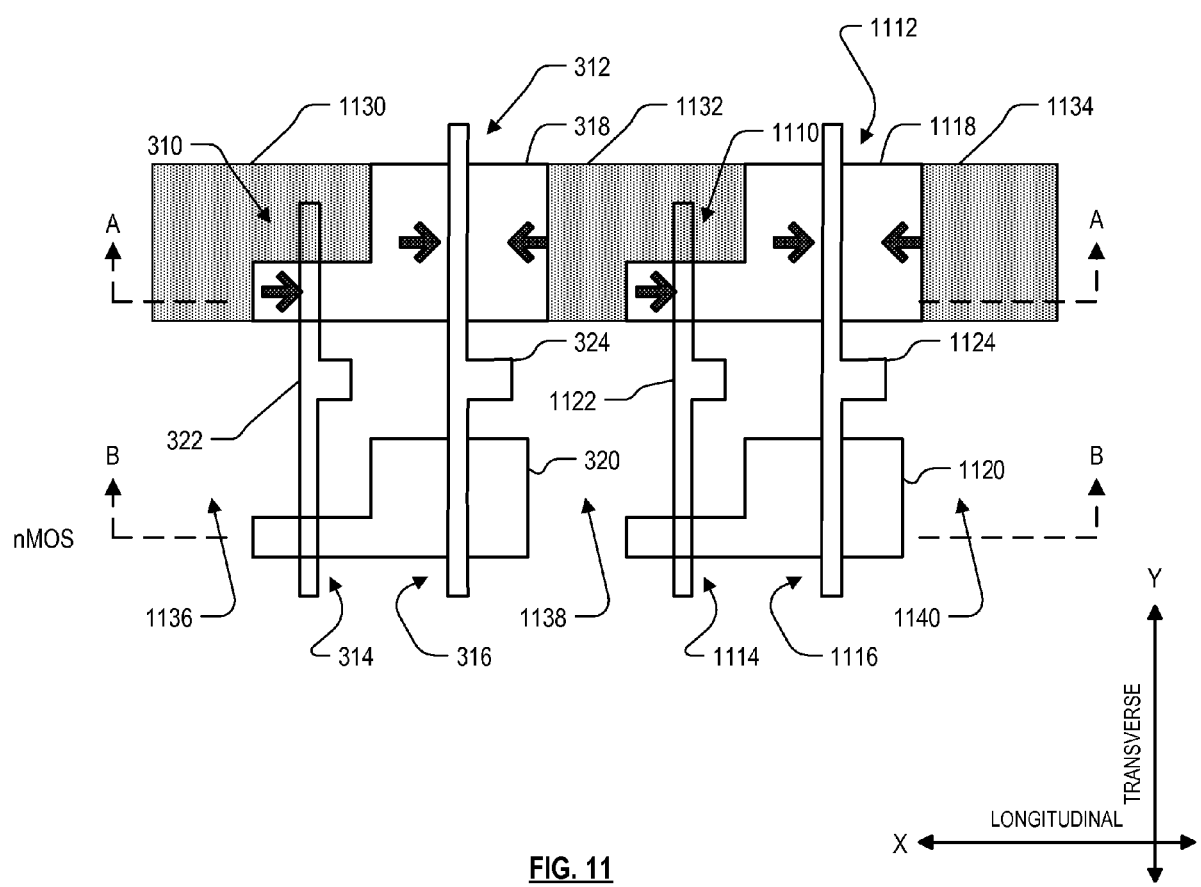
FIG. 11 illustrates a layout region that includes certain transistors from FIG. 3, as well as others.

FIG. 11 illustrates a layout region that includes the four transistors 310, 312, 314 and 316 from FIG. 3, as well as four additional transistors 1110, 1112, 1114 and 1116 similar to transistors 310, 312, 314 and 316 and in a grouping immediately to the right in the drawing. The transistors 1110, 1112, 1114 and 1116 are defined by gate conductors 1122 and 1124 crossing P-channel diffusion region 1118 and N-channel diffusion region 1120. All of the STI regions shown in the drawing are suppressed, except for the shaded STI regions 1130, 1132 and 1134. STI region 1130 is longitudinally adjacent to P-channel diffusion region 318, and STI region 1132 is longitudinally adjacent to both P-channel diffusion regions 318 and 1118. STI region 1134 is longitudinally adjacent to P-channel diffusion region 1118. The STI regions 1130, 1132 and 1134 have an elevation that is at least as high as that of the channel regions of each of the P-channel transistors 310, 312, 1110 and 1112. Typically the elevation of these STI regions will be higher than that of the channel regions, but it is sufficient that it be at least as high as the channel regions as useful for retaining the compressive stress they exert longitudinally on the four P-channel transistors. The technique of suppressing STI regions is beneficial by itself as previously described, but it is preferred that the STI regions longitudinally-adjacent to P-channel diffusions retain a higher elevation than that of other STI regions.

Figure 11A:
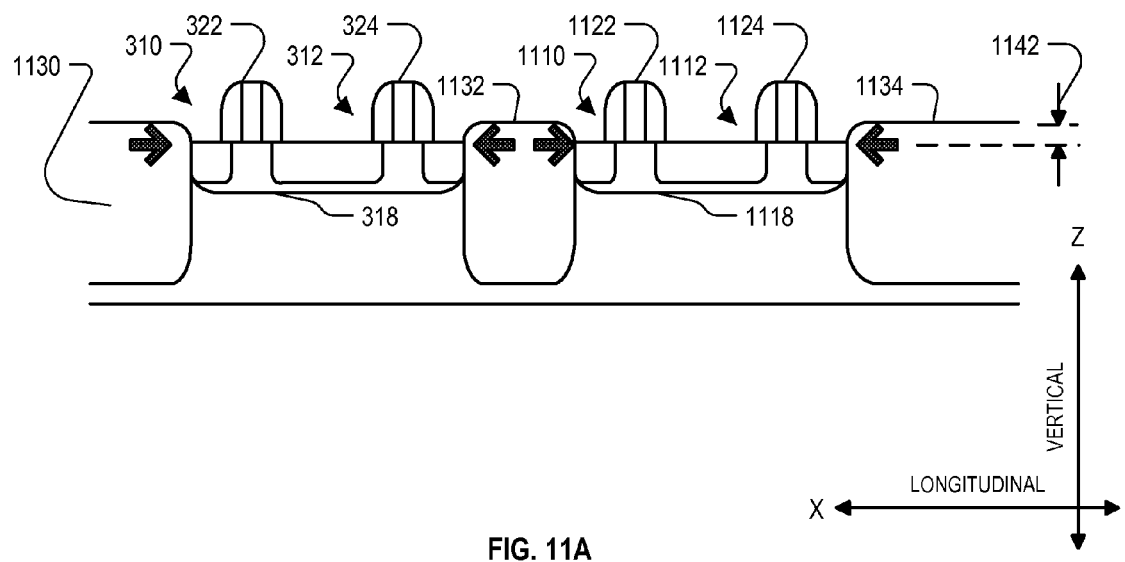
FIG. 11A is a cross-sectional view of the layout region of FIG. 11, taken at sight lines A-A.

FIG. 11A is a cross-sectional view of the layout region of FIG. 11, taken at sight lines A-A. In this drawing the gate stacks 322, 324, 1122 and 1124 are shown symbolically as including the spacers longitudinally bracketing the gate conductors themselves. In this cross-section, only the P-channel transistors 310, 312, 1110 and 1112 are shown. It can be seen that the STI regions 1130, 1132 and 1134 longitudinally adjacent to the P-channel diffusions 318 and 1118 are elevated above the level of the diffusion regions 318 and 1118. The elevation is designated as 1142 in FIG. 11A, but the amount is unimportant for purposes of the present discussion since it is significant only that the elevation be at least as high as that of the diffusion regions 318 and 1118. As such, the STI regions exert beneficial compressive stress longitudinally into the diffusions 318 and 1118, including into the channel regions below gate stacks 322, 324, 1122 and 1124.

Figure 11B:
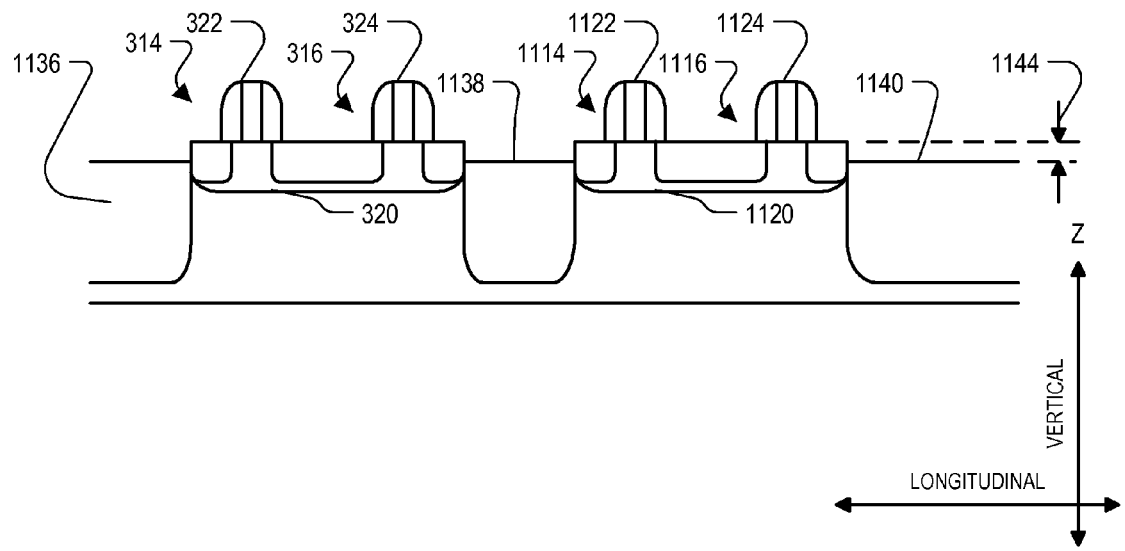
FIG. 11B is a cross-sectional view of the layout region of FIG. 11, taken at sight lines B-B.

FIG. 11B is a cross-sectional view of the layout region of FIG. 11, taken at sight lines B-B. As in FIG. 11A, the gate stacks 322, 324, 1122 and 1124 in FIG. 11B are shown symbolically as including the spacers longitudinally bracketing the gate conductors themselves. In this cross-section, only the N-channel transistors 314, 316, 1114 and 1116 are shown. It can be seen that for the N-channel transistors, unlike for the P-channel transistors, the diffusions 320 and 1120 are elevated above the level of the STI regions 1136, 1138 and 1140 longitudinally adjacent to the diffusion regions 320 and 1120. The elevation of the channels is designated as 1144 in FIG. 11B, and in various embodiments the amount of the elevation can be, for example, 10 nm. More advantageously the elevation is 50 nm, and even more advantageously it is 100 nm. Since the diffusion regions 320 and 1120 are elevated above the level of the surrounding STI regions, the compressive stress exerted both longitudinally and transversely into the diffusions 320 and 1120, and more particularly into the channel regions below gate stacks 322, 324, 1122 and 1124, is exerted below the surface where most of the current flows.

Figure 12A:
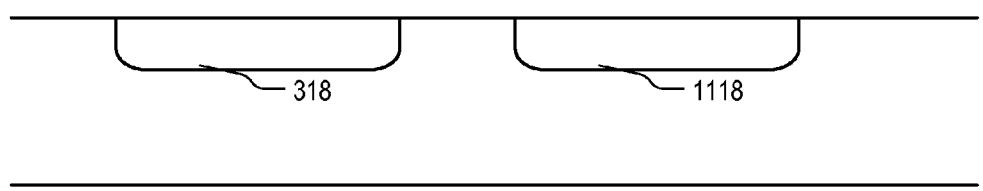
FIGS. 12A, 12B and 12C illustrate fabrication steps that can be used to form the P-channel structures of FIG. 11A.
Figure 12B:
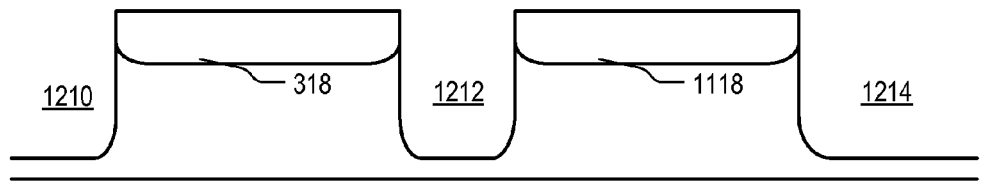
Figure 12C:
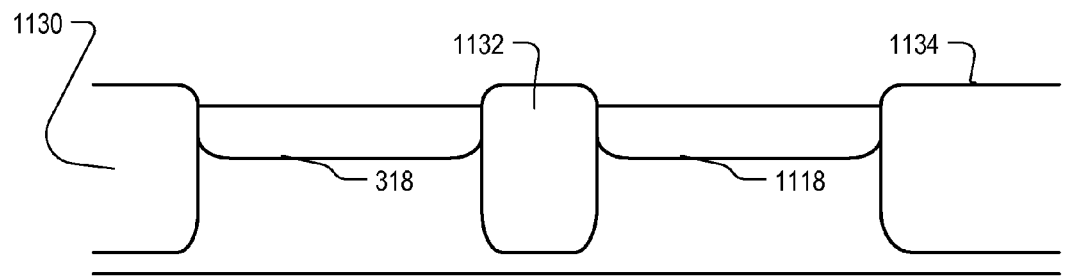

FIGS. 12A, 12B and 12C illustrate fabrication steps that can be used to form the P-channel structures of FIG. 11A, and FIGS. 13A, 13B, 13C and 13D illustrate fabrication steps that can be used to form the N-channel structures of FIG. 11B. An embodiment will be described in which both are formed in a common sequence of steps. It will be understood that the process steps actually take place after step 130 (FIG. 1), but the steps (at least to the level of detail shown) are fully anticipated and intended during the layout generation steps up to and including step 124 and beyond.

Figure 13A:
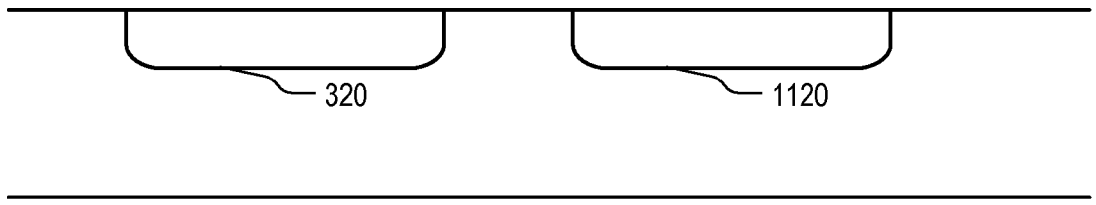
FIGS. 13A, 13B, 13C and 13D illustrate fabrication steps that can be used to form the N-channel structures of FIG. 11B.
Figure 13B:
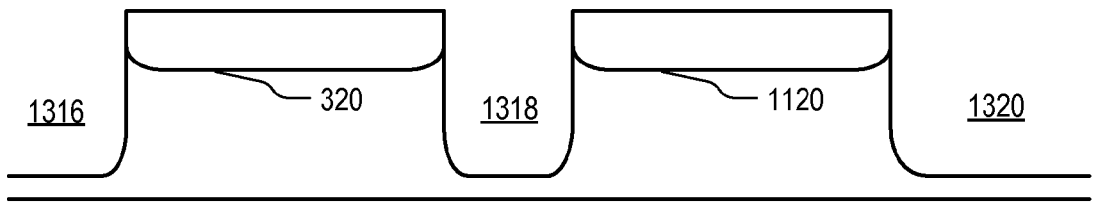
Figure 13C:
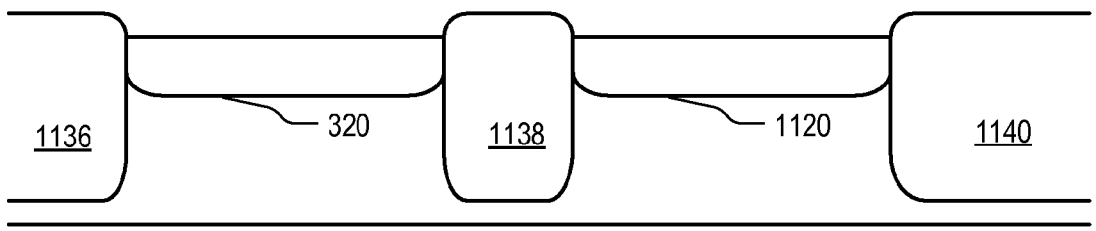

In FIG. 12A, P-channel diffusions 318 and 1118 are formed by conventional techniques. In FIG. 13A, N-channel diffusions 320 and 1120 are also formed by conventional techniques.

In FIG. 12B, trenches 1210, 1212 and 1214 are etched into the substrate for STI regions 1130, 1132 and 1134, respectively. Simultaneously, in FIG. 13B, trenches 1316, 1318 and 1320 are etched in to the substrate for STI regions 1136, 1138 and 1140, respectively.

In FIG. 12C, trenches 1210, 1212 and 1214 are filled with an oxide to form the STI regions 1130, 1132 and 1134, respectively. Simultaneously, in FIG. 13C, trenches 1316, 1318 and 1320 are filled with an oxide to form the STI regions 1136, 1138 and 1140, respectively.

Next, a masking material is formed over the surface of the wafer, and opened lithographically over all the STI regions except those longitudinally-adjacent to P-channel diffusions. In FIG. 11, the only STI regions remaining protected by the etch mask material are STI regions 1130, 1132 and 1134.

Figure 13D:
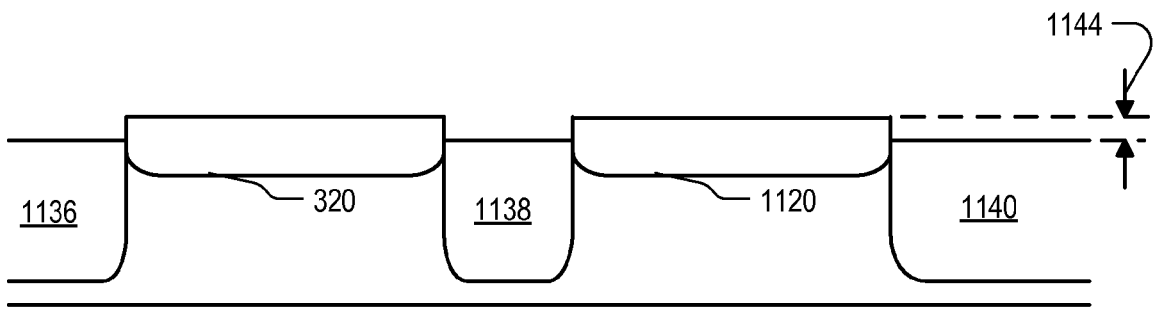

Next, the STI regions not protected by the masking material are etched back, or otherwise reduced in elevation, to the desired level of suppression below the wafer surface. For the P-channel transistors, the cross-section remains the same as shown in FIG. 12C. For the N-channel transistors, the resulting cross-section is as shown in FIG. 13D. As can be seen in FIG. 13D, the resulting STI regions 1136, 1138 and 1140 are suppressed below the substrate surface by the elevation differential 1144.

It is noteworthy that the elevation reduction of STI is performed before the gate stack is applied. Conventionally oxide is overfilled into the STI trenches and then etched-back or chemically-mechanically polished back to approximately the level of a superposing masking layer. The gate stack is applied thereafter, and during several oxide etching steps that are done later, the STI oxide unintentionally may be etched back to a level below the channel diffusions. But any STI oxide that lies below the gate stack is protected from the latter etchbacks. Since the gate stack typically extends beyond the diffusion regions transversely, the gate stack precludes any suppression of the STI, transversely adjacent to the channel regions, to a level below the channel diffusions. So even if the STI oxide were to be etched-back or polished-back to a level below that of the channel diffusions, it would still be elevated above (or at least as high as) the channel regions at the transversely-adjacent borders thereof. As previously explained, STI in those locations applies detrimental compressive stress transversely into the channel, thereby degrading performance of both N-channel and P-channel transistors.

By contrast, the steps of FIGS. 12A, 12B, 12C, 13A, 13B, 13C and 13D are all performed before the gate stacks are applied. Thus they result in suppression of the STI transversely-adjacent to all the diffusion regions, as well as longitudinally-adjacent to the diffusion regions. Accordingly, after the STI oxide etch-back step, the gate stacks are applied and the source and drain diffusions are formed, by conventional techniques, resulting in the structures shown in FIGS. 11A and 11B.

It will be appreciated that the process steps above, for applying the masking material, opening it over only the desired STI regions, and reducing the elevation of only those STI regions exposed through the masking material, can for many fabrication processes be performed as part of existing fabrication process steps. For such processes, no additional steps are required to form the elevation differentials. In addition, it will also be appreciated that the formation of elevation differentials not only helps to improve device performance, but also can greatly reduce layout sensitivity of transistor performance.

In an alternative embodiment, the desired elevation differentials are formed by selective silicon epitaxy instead of by over-etching STI material.

Figure 14:
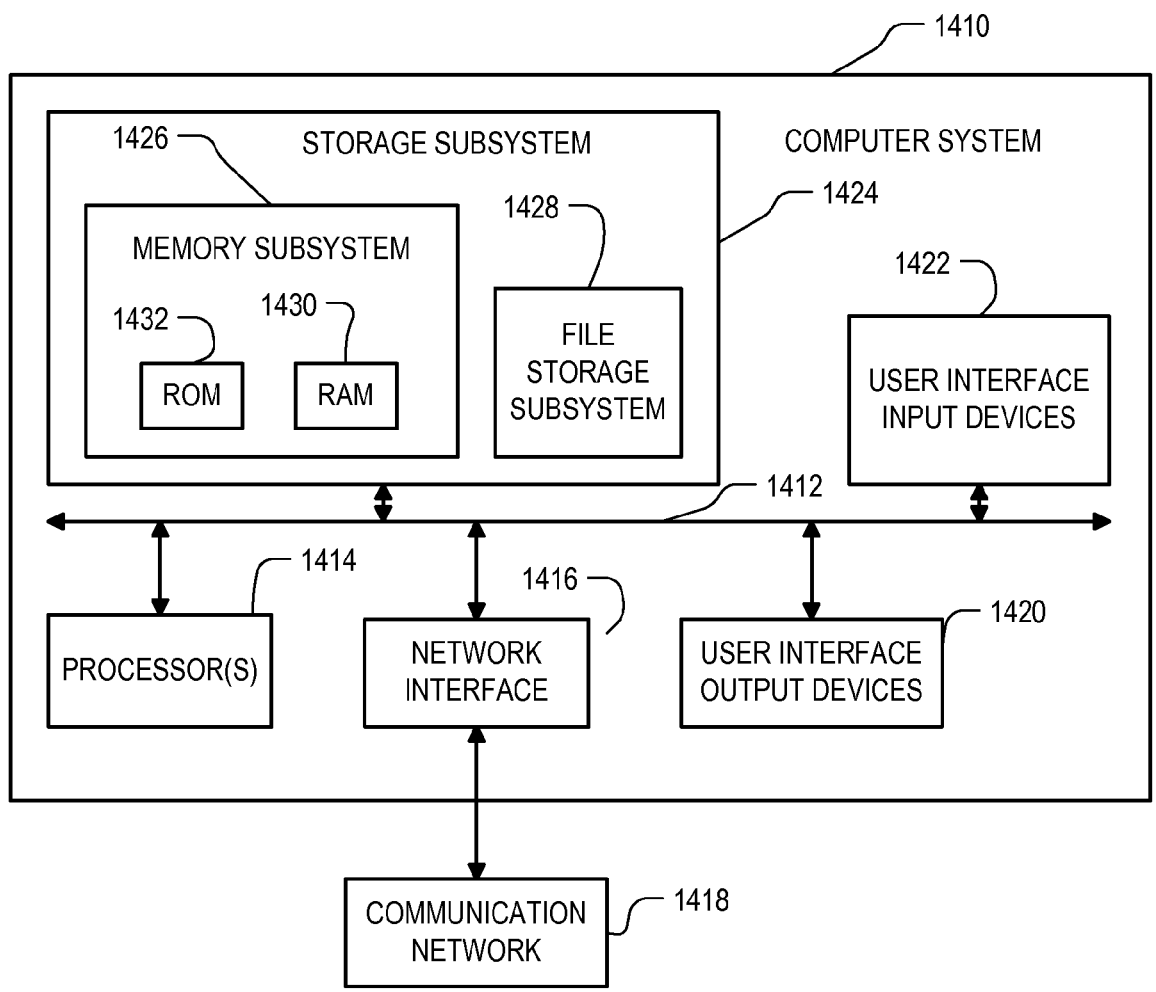
FIG. 14 is a simplified block diagram of a computer system suitable for performing various steps shown in FIGS. 1 and 2.

FIG. 14 is a simplified block diagram of a computer system 1410 suitable for performing various steps shown in FIGS. 1 and 2. In one embodiment a single computer system is used for performing all the steps, whereas in another embodiment different computer systems are used for various different ones of the steps. Computer system 1410 typically includes at least one processor 1414 which communicates with a number of peripheral devices via bus subsystem 1412. These peripheral devices may include a storage subsystem 1424, comprising a memory subsystem 1426 and a file storage subsystem 1428, user interface input devices 1422, user interface output devices 1420, and a network interface subsystem 1416. The input and output devices allow user interaction with computer system 1410. Network interface subsystem 1416 provides an interface to outside networks, including an interface to communication network 1418, and is coupled via communication network 1418 to corresponding interface devices in other computer systems. Communication network 1418 may comprise many interconnected computer systems and communication links. These communication links may be wireline links, optical links, wireless links, or any other mechanisms for communication of information. While in one embodiment, communication network 1418 is the Internet, in other embodiments, communication network 1418 may be any suitable computer network.

User interface input devices 1422 may include a keyboard, pointing devices such as a mouse, trackball, touchpad, or graphics tablet, a scanner, a touchscreen incorporated into the display, audio input devices such as voice recognition systems, microphones, and other types of input devices. In general, use of the term "input device" is intended to include all possible types of devices and ways to input information into computer system 1410 or onto computer network 1418.

User interface output devices 1420 may include a display subsystem, a printer, a fax machine, or non-visual displays such as audio output devices. The display subsystem may include a cathode ray tube (CRT), a flat-panel device such as a liquid crystal display (LCD), a projection device, or some other mechanism for creating a visible image. The display subsystem may also provide non-visual display such as via audio output devices. In general, use of the term "output device" is intended to include all possible types of devices and ways to output information from computer system 1410 to the user or to another machine or computer system.

Storage subsystem 1424 stores the basic programming and data constructs that provide the functionality of certain embodiments of the present invention. For example, the various modules implementing the functionality of certain embodiments of the invention may be stored in storage subsystem 1424. These software modules, when executed by processor 1414, perform computer-implemented steps of FIGS. 1 and 2.

Memory subsystem 1426 typically includes a number of memories including a main random access memory (RAM) 1430 for storage of instructions and data during program execution and a read only memory (ROM) 1432 in which fixed instructions are stored. File storage subsystem 1428 provides persistent storage for program and data files, and may include a hard disk drive, a floppy disk drive along with associated removable media, a CD-ROM drive, an optical drive, or removable media cartridges. The databases and modules implementing the functionality of certain embodiments of the invention may be stored by file storage subsystem 1428.

Bus subsystem 1412 provides a mechanism for letting the various components and subsystems of computer system 1410 communicate with each other as intended. Although bus subsystem 1412 is shown schematically as a single bus, alternative embodiments of the bus subsystem may use multiple busses.

Computer system 1410 itself can be of varying types including a personal computer, a portable computer, a workstation, a computer terminal, a network computer, a television, a mainframe, or any other data processing system or user device. Due to the ever-changing nature of computers and networks, the description of computer system 1410 depicted in FIG. 14 is intended only as a specific example for purposes of illustrating certain embodiments of the present invention. Many other configurations of computer system 1410 are possible having more or less components than the computer system depicted in FIG. 14.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

The invention claimed is:

1. A method for forming an integrated device, comprising the steps of:
- forming a first diffusion well for the device, the first diffusion well including a first channel region for a first transistor, the first transistor being an N-channel transistor, the first channel region defining longitudinal and transverse directions for the first diffusion well;
- forming a second diffusion well for the device, the second diffusion well including a second channel region for a second transistor, the second transistor being a P-channel transistor, the second channel region defining longitudinal and transverse directions for the second diffusion well;
- forming a first STI region transversely adjacent to the first diffusion well, such that the first channel region is elevated relative to the first STI region;
- forming a second STI region longitudinally adjacent to the first diffusion well, such that the first channel region is elevated also relative to the second STI region;
- forming a third STI region transversely adjacent to the second diffusion well, such that the second channel region is elevated relative to the third STI region;
- forming a fourth STI region longitudinally adjacent to the second diffusion well, such that the second channel region is not elevated relative to the fourth STI region;
- forming a first gate conductor overlying the first channel region after the step of forming a first STI region;
- forming a second gate conductor overlying the second channel region after the step of forming a third STI region;
- forming first source and drain regions for the first transistor in the first diffusion well on opposite sides of the first channel region longitudinally; and
- forming second source and drain regions for the second transistor in the second diffusion well on opposite sides of the second channel region longitudinally.

2. The method of claim 1, wherein the steps of forming first, second, third and fourth STI regions collectively comprise the steps of:
- forming respective first, second, third and fourth depressions for the first, second, third and fourth STI regions;
- filling each of the first, second, third and fourth depressions with STI material to an elevation at least as high as the first and second diffusion regions;
- applying a masking layer over at least the STI regions, the masking material exposing the first, second and third STI regions but protecting the fourth STI region; and
- reducing the elevation of only those STI regions exposed through the masking layer.

* * * * *